(12) United States Patent
Lutker-Lee et al.

(10) Patent No.: US 12,334,391 B2
(45) Date of Patent: Jun. 17, 2025

(54) METHOD FOR PATTERNING A SUBSTRATE USING PHOTOLITHOGRAPHY

(71) Applicant: Tokyo Electron Limited, Tokyo (JP)

(72) Inventors: Katie Lutker-Lee, Albany, NY (US); Angelique Raley, Albany, NY (US); Nicholas Joy, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 636 days.

(21) Appl. No.: 17/644,932

(22) Filed: Dec. 17, 2021

(65) Prior Publication Data
US 2023/0197505 A1 Jun. 22, 2023

(51) Int. Cl.
| | |
|---|---|
| H01L 21/768 | (2006.01) |
| G03F 1/22 | (2012.01) |
| G03F 7/095 | (2006.01) |
| G03F 7/20 | (2006.01) |
| H01L 21/027 | (2006.01) |

(52) U.S. Cl.
CPC .......... *H01L 21/76811* (2013.01); *G03F 1/22* (2013.01); *G03F 7/095* (2013.01); *G03F 7/2004* (2013.01); *H01L 21/0274* (2013.01); *H01L 21/76877* (2013.01)

(58) Field of Classification Search
CPC ................................................ H01L 21/76811
See application file for complete search history.

(56) References Cited

U.S. PATENT DOCUMENTS

| | | | |
|---|---|---|---|
| 10,043,714 B2 | 8/2018 | Blatchford et al. | |
| 10,950,444 B2 | 3/2021 | Lu et al. | |
| 2015/0044870 A1 | 2/2015 | Cheng et al. | |
| 2018/0040474 A1* | 2/2018 | Zi | G03F 7/0752 |
| 2019/0056914 A1* | 2/2019 | Ma | G03F 7/38 |
| 2020/0241413 A1* | 7/2020 | Clark | G03F 7/2004 |
| 2021/0011383 A1* | 1/2021 | Cardineau | G03F 7/0043 |
| 2021/0271170 A1* | 9/2021 | Telecky | G03F 7/0042 |
| 2021/0358751 A1* | 11/2021 | Gao | H01L 21/0276 |
| 2022/0199406 A1* | 6/2022 | Kalutarage | G03F 7/0042 |
| 2022/0342302 A1* | 10/2022 | Kalutarage | G03F 7/40 |

OTHER PUBLICATIONS

Derbyshire, Katherine, "EUV Resists Move Forward," Promising results from critical areas, https://semiengineering.com/euv-resists-move-forward/, Semiconductor Engineering, Mar. 23, 2016, 2 pages.

(Continued)

*Primary Examiner* — William A Harriston
(74) *Attorney, Agent, or Firm* — Slater Matsil, LLP

(57) ABSTRACT

A method for patterning a substrate includes: forming a first photoresist etch mask with an extreme ultraviolet (EUV) lithography process, the first photoresist etch mask including first through openings, the first photoresist etch mask including a metal-based photoresist material; forming a second photoresist etch mask over the first photoresist etch mask, the second photoresist etch mask including second through openings; and forming first openings, through the first and the second photoresist etch masks, in a region of the substrate that vertically overlaps both the first through openings and the second through openings.

20 Claims, 12 Drawing Sheets

(56) References Cited

OTHER PUBLICATIONS

Derbyshire, Katherine, "The Next Resists," Chemically amplified photoresists are out of steam where EUV is concerned, https://semiengineering.com/the-next-resists/, Semiconductor Engineering, Oct. 22, 2015, 3 pages.

Fallica, Roberto et al., "Absorption coefficient of metal-containing photoresists in the extreme ultraviolet," Journal of Micro/Nanolithography, MEMS and MOEMS, Apr.-Jun. 2018, 9 pages.

Grzeskowiak, Steven, et al., "Reactivity of Metal Oxalate EUV Resists as a Function of the Central Metal," Suny Polytechnic Institute, EUVL Workshop, Jun. 2017, Berkeley, CA, 20 pages.

Hinsberg, W. et al., "A Numeric Model for the Imaging Mechanism of Metal Oxide EUV Resists," Inpria, EUVL Workshop 2018, 21 pages.

Hori, Masafumi, et al., "Sub-40-nm half-pitch double patterning with resist freezing process, " Proc. SPIE 6923, Advances in Resist Materials and Processing Technology XXV, 69230H, Mar. 26, 2008, 1 page.

Kalyani, Dr. Vishwanath, et al., "Polyoxometalates New olyoxometalates Containing Hybrid Polymers and Their Potential for Nano-Patterning," Chemistry a European Journal, Nov. 27, 2014, 2 pages.

Luo, Chaoyun, et al., "Review of recent advances in inorganic photoresists," The Royal Society of Chemistry 2020, Feb. 28, 2020, RSC Adv., 10, 8385-8395.

Ober, Christopher et al., "EUV Photolithography: Resist Progress and Challenges," Proceedings of SPIE, vol. 10583, Sep. 2021, 14 pages.

Stowers, Jason, "Metal Oxide Photoresists: Breaking Paradigms in EUV Lithography," 2017, EUVL Workshop, 17 pages.

Wang, Zhihao, et al., "Recent Advances in Organic-inorganic Hybrid Photoresists," J. Microelectron. Manuf. 4 (1), Mar. 31, 2021, 15 pages.

* cited by examiner

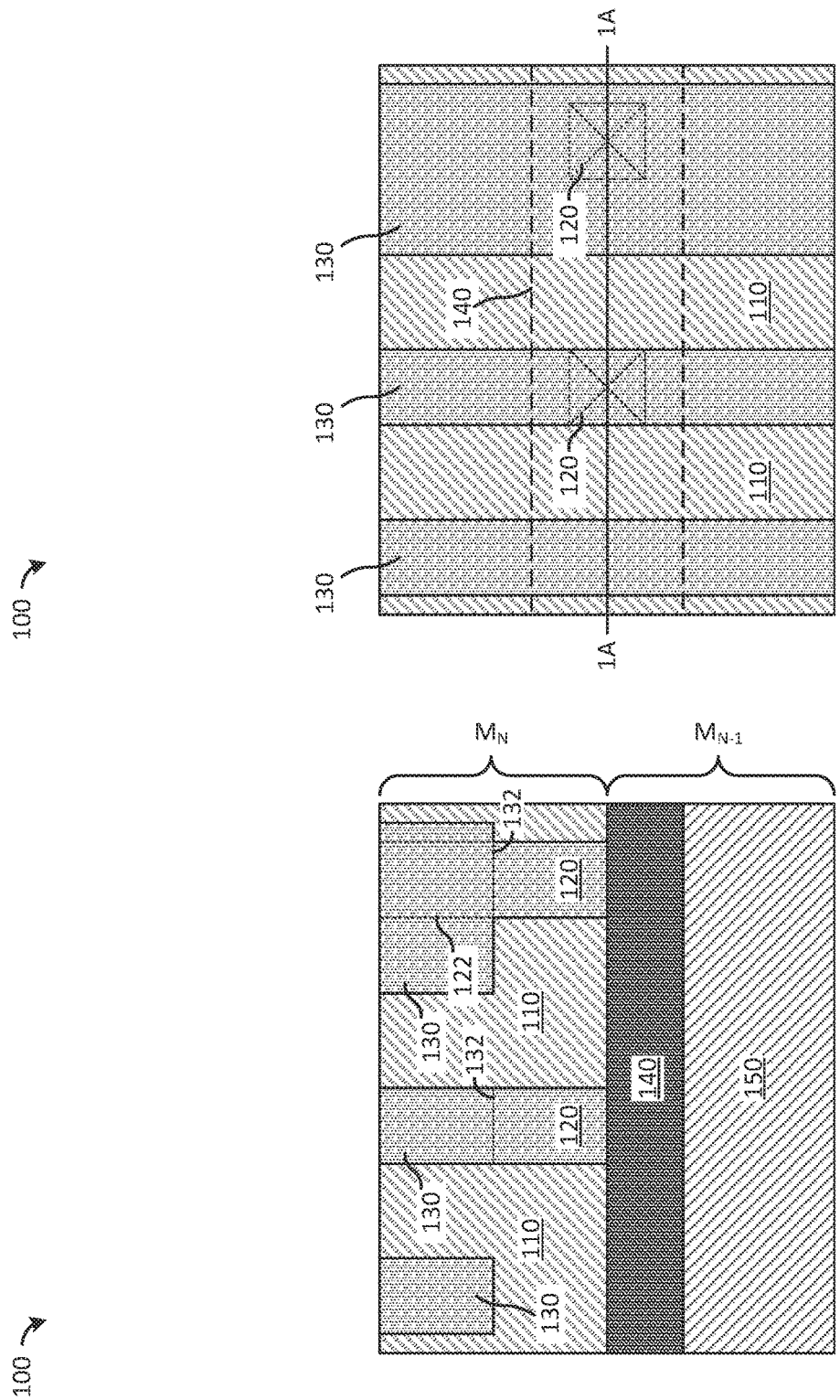

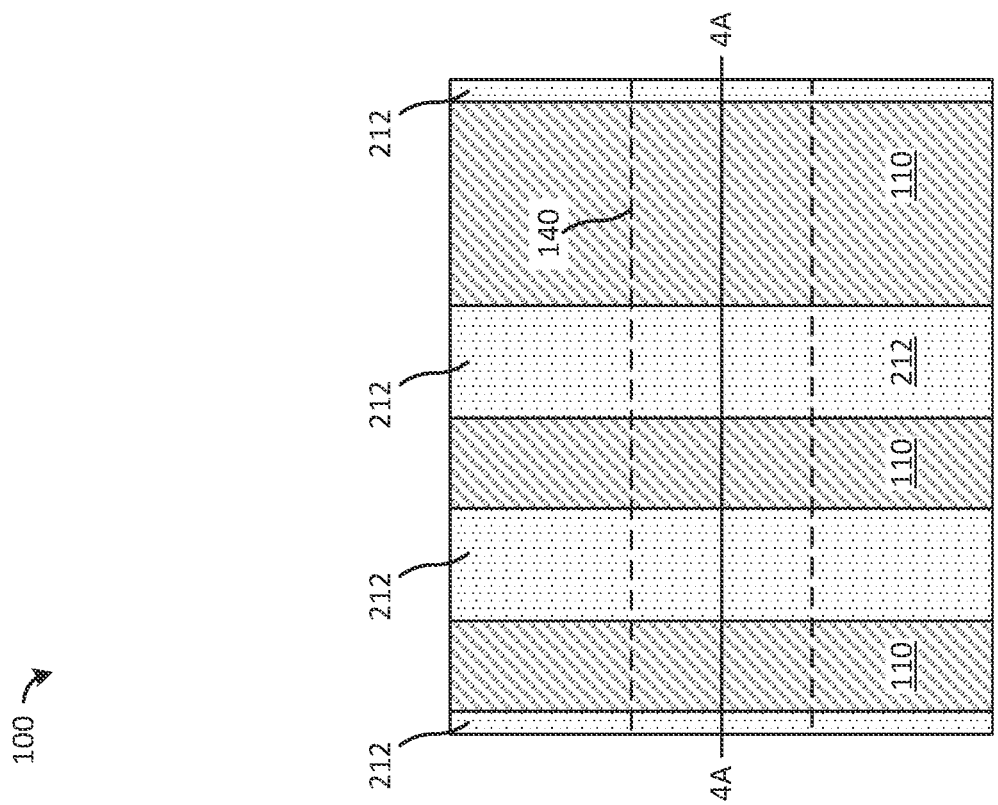
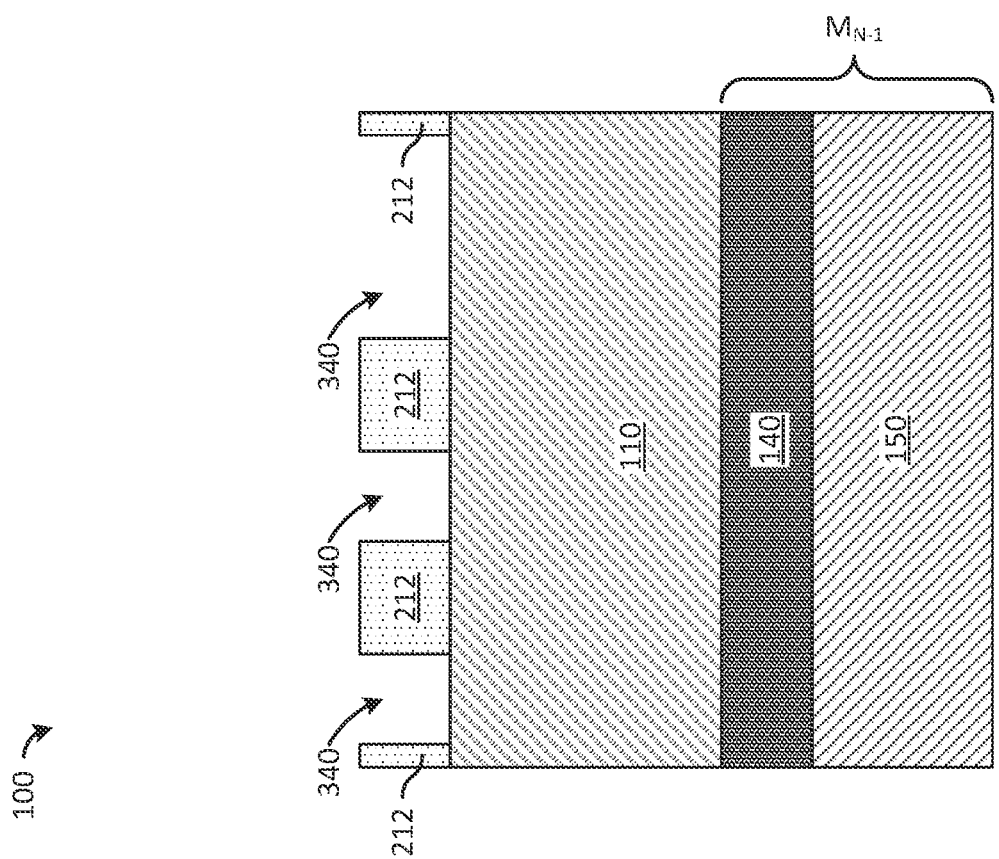
FIGURE 4A
FIGURE 4B

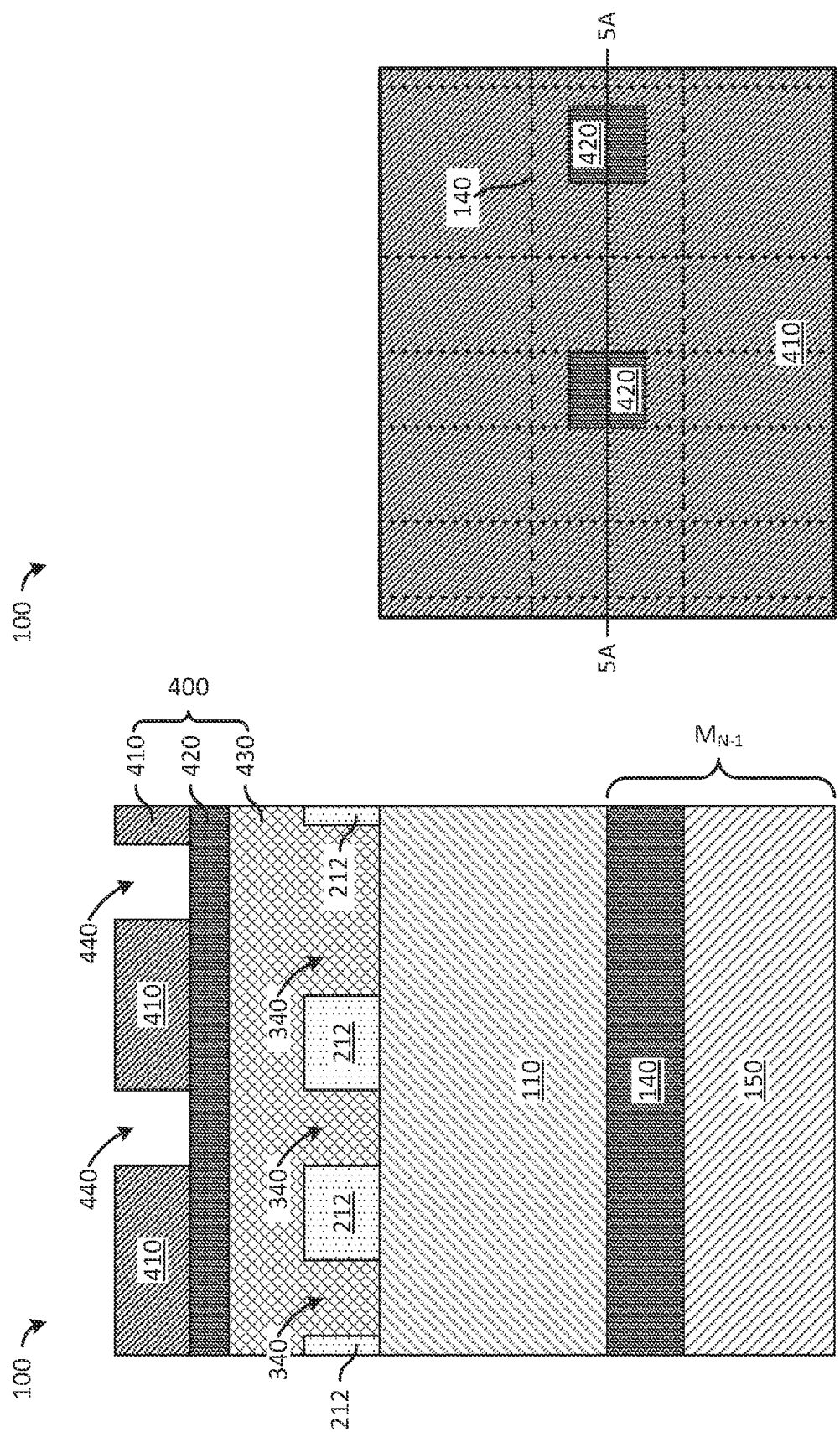

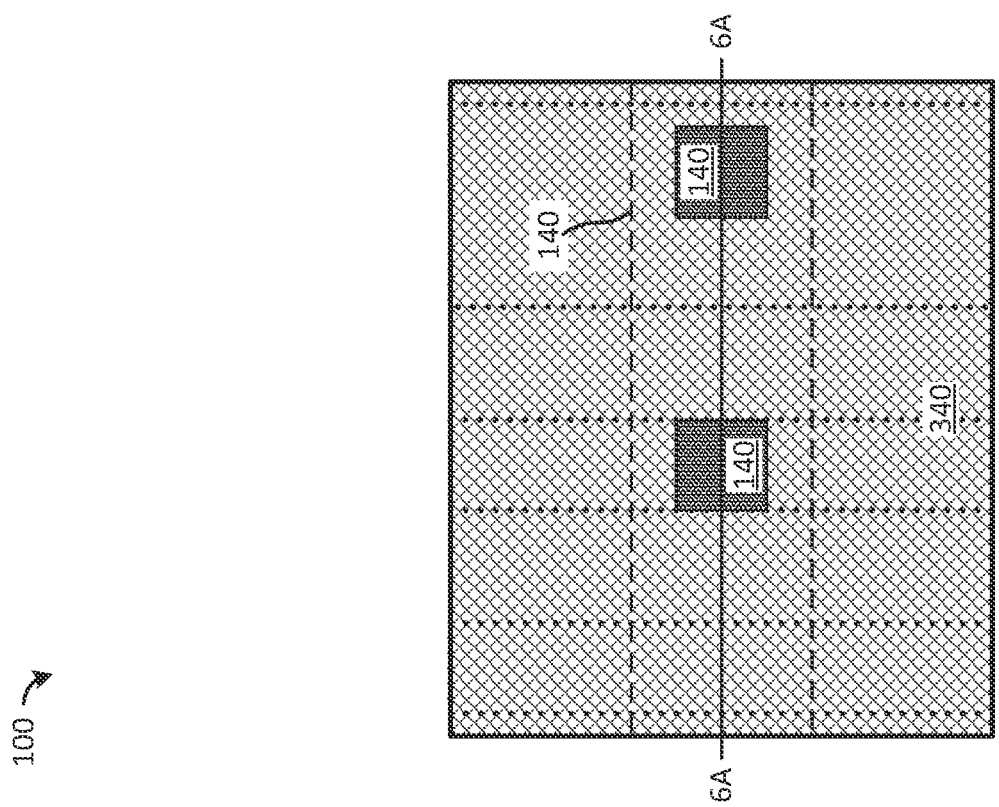
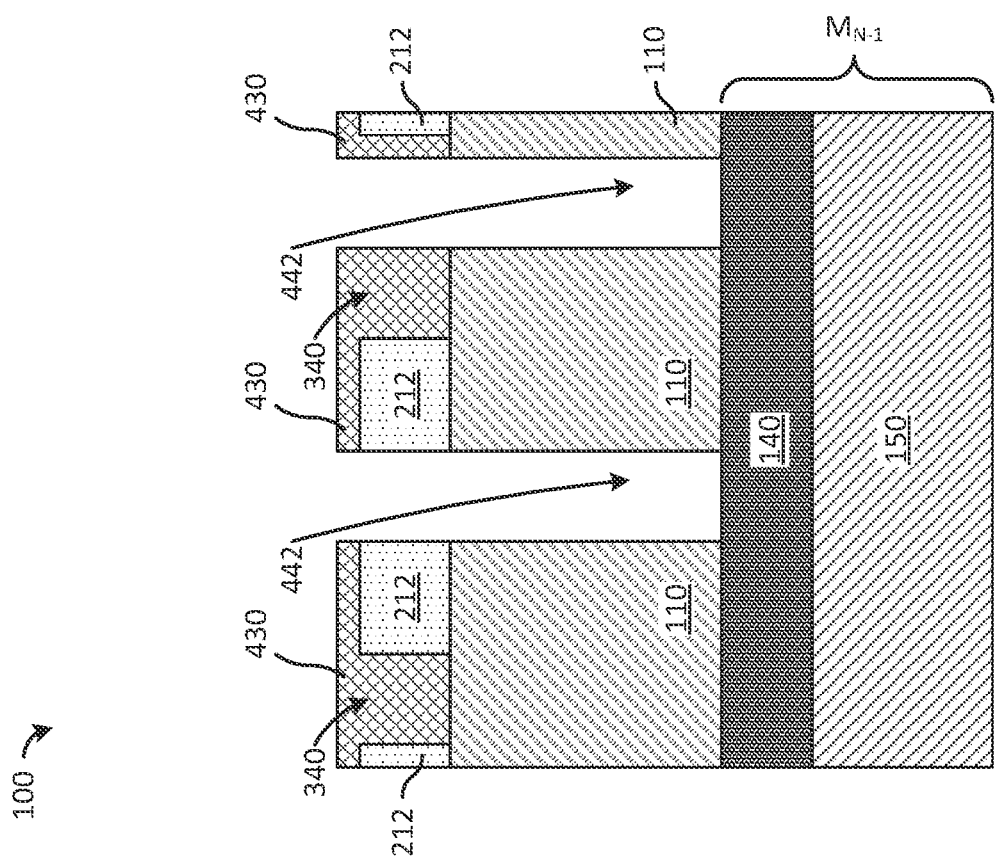
FIGURE 6A
FIGURE 6B

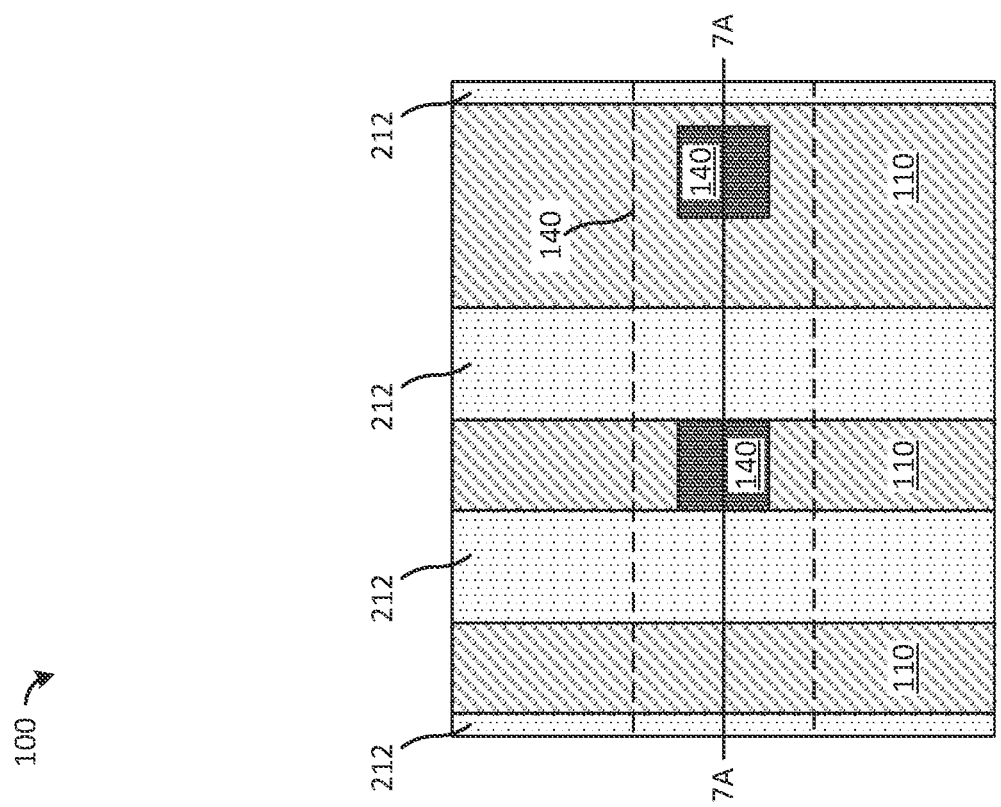
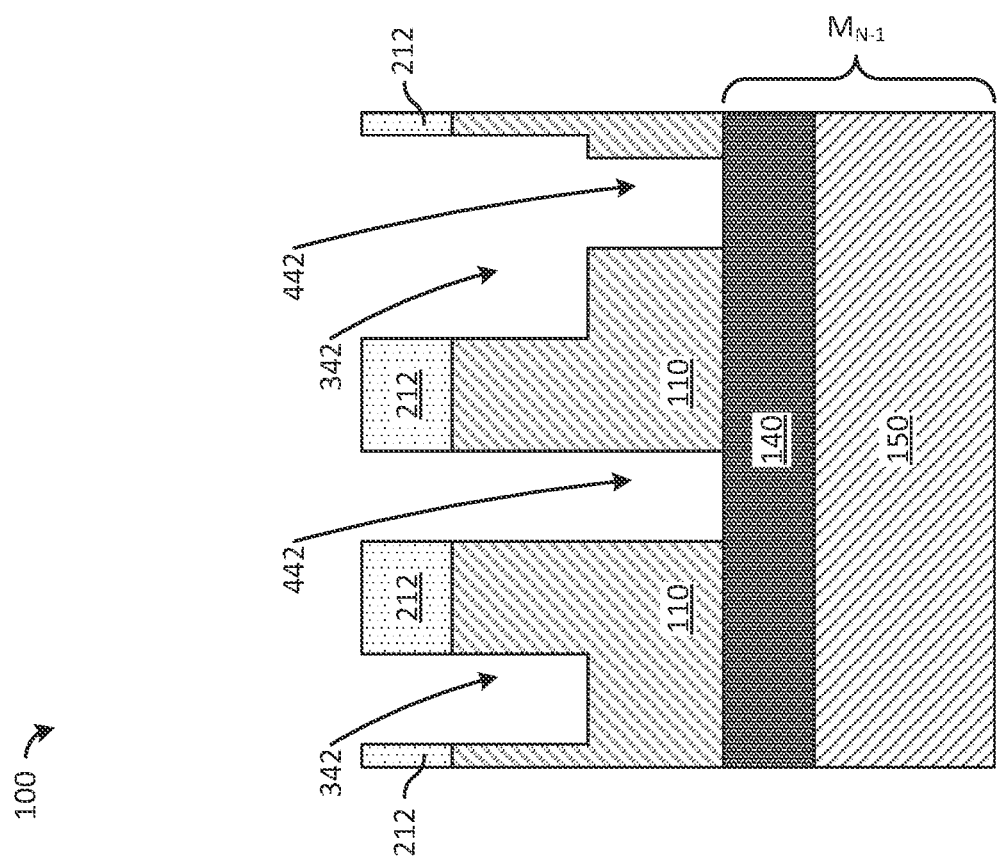
FIGURE 7A
FIGURE 7B

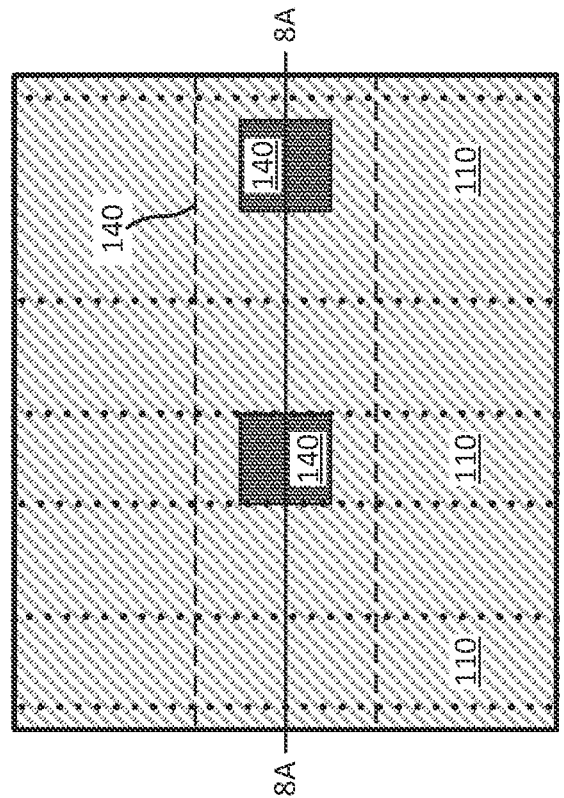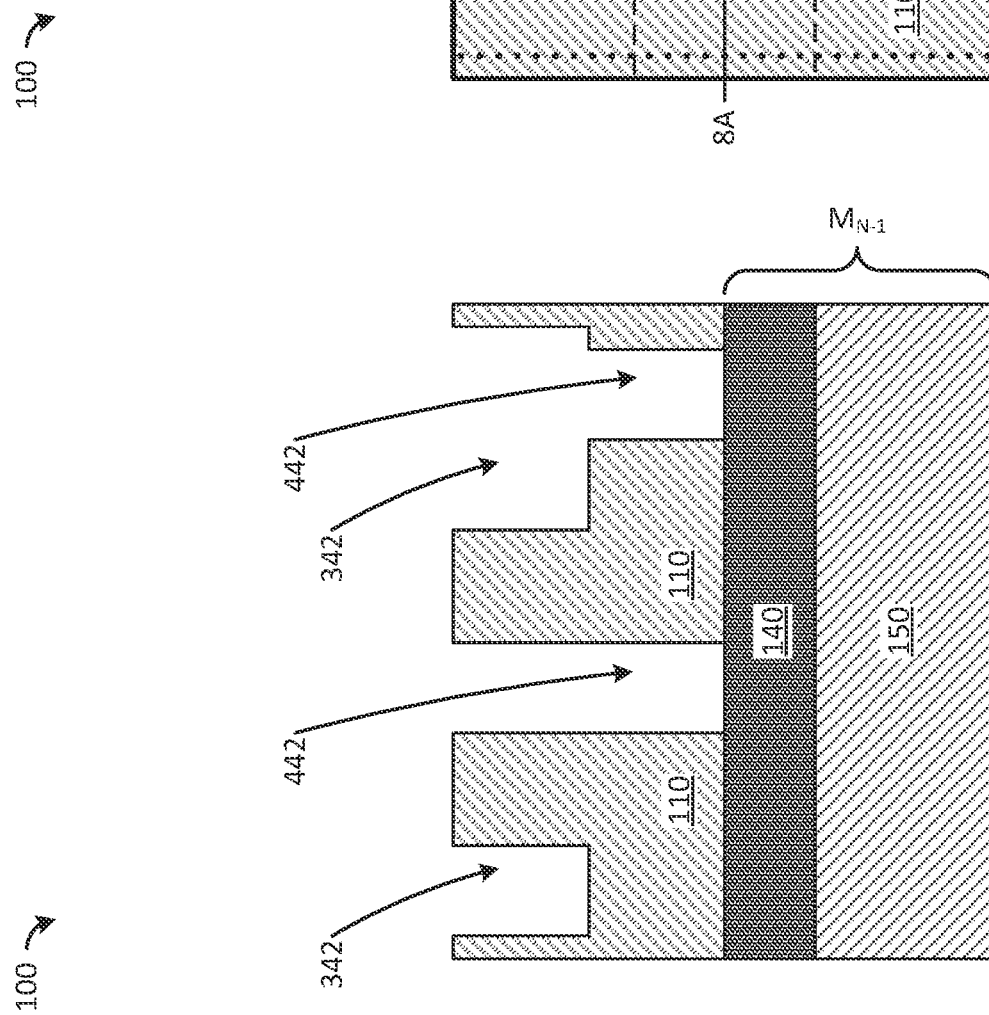

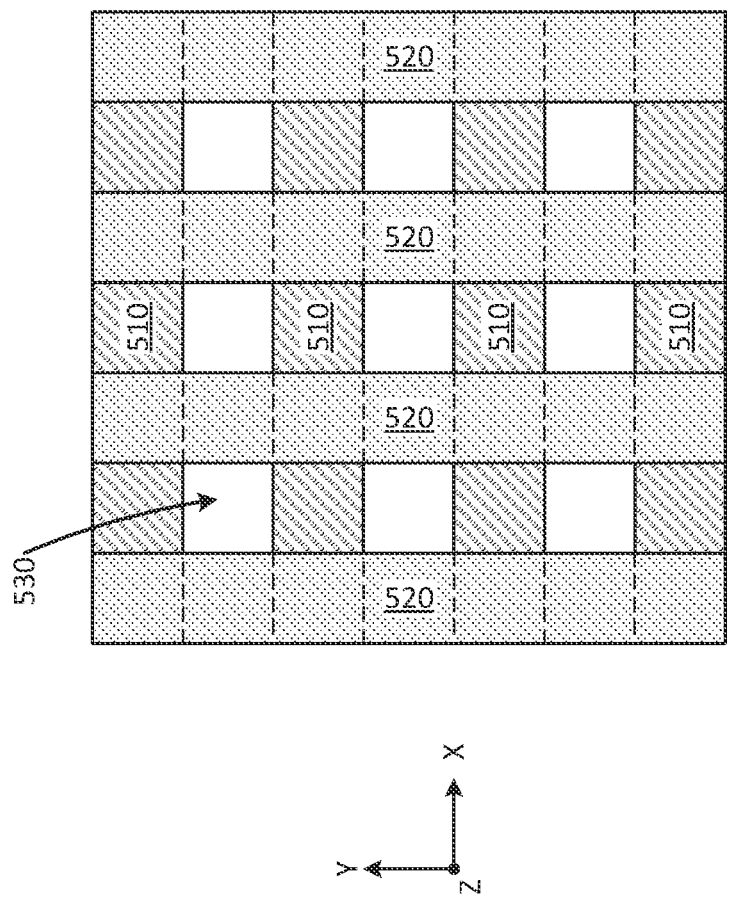

METHOD FOR PATTERNING A SUBSTRATE USING PHOTOLITHOGRAPHY

TECHNICAL FIELD

The present invention relates generally to methods for semiconductor processing, and, in particular embodiments, to a method for patterning a substrate using photolithography.

BACKGROUND

Generally, an integrated circuit (IC) is fabricated by sequentially depositing and patterning layers of dielectrics, metals, and semiconductors over a substrate to form a network of electronic components connected by metal lines and vias in a monolithic structure. Enabled by advances in lithography, feature sizes are shrunk to double the packing density every two years. One path to higher resolution patterns is reducing wavelength ($\lambda$) of the light source. The 248 nm KrF laser was replaced by 193 nm ArF laser to pattern the feature sizes in IC designs at the 14 nm and even 10 nm nodes with the aid of immersion lithography and multiple patterning using extra masks. To keep the mask count manageable, the shorter 13.5 nm $\lambda$ extreme ultraviolet (EUV) lithography may be needed to print finer features at the sub-10 nm regime. Deployment of EUV in high volume manufacturing involves developing and assembling the major components of lithography, such as the radiation source, masks, optics, scanner, and photoresist into one system. Early efforts to modify traditional organic chemically amplified resists (CAR) to be suitable for patterning with EUV radiation had insurmountable problems. A new class of photoresists, known as metal-based photoresists, has been developed. By incorporating metal atoms, these photoresists have higher sensitivity to EUV radiation, higher etch resistance, and higher structural stability. Further innovation is needed to explore the use of these materials in semiconductor processing.

SUMMARY

A method for patterning a substrate includes: forming a first photoresist etch mask with an extreme ultraviolet (EUV) lithography process, the first photoresist etch mask including first through openings, the first photoresist etch mask including a metal-based photoresist material; forming a second photoresist etch mask over the first photoresist etch mask, the second photoresist etch mask including second through openings; and forming first openings, through the first and the second photoresist etch masks, in a region of the substrate that vertically overlaps both the first through openings and the second through openings.

A method for patterning an unpatterned metal layer of a substrate includes: forming a first photoresist layer over the unpatterned metal layer, the first photoresist layer including a first metal-based photoresist material disposed over the unpatterned metal layer; forming a first metal-based hard mask directly from the first photoresist layer by exposing the first photoresist layer to a pattern of EUV radiation and developing the exposed first photoresist layer; and after forming a first metal-based hard mask, etching the unpatterned metal layer by exposing the substrate to an etchant, the etching selectively removing a portion of the unpatterned metal layer that is exposed to the etchant.

A method for patterning a layer-to-be-patterned in a substrate includes: forming, using a EUV lithography process, a patterned bilayer hard mask including a metal layer and a first metal-based photoresist layer over the metal layer, the bilayer hard mask being formed over the layer-to-be-patterned; and etching the layer-to-be-patterned by exposing the substrate to an etchant, the etching selectively removing a portion of the layer-to-be-patterned that is exposed to the etchant.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a cross-sectional view of an interconnect level formed in a substrate, in accordance with some embodiment;

FIG. 1B illustrates a planar view of the interconnect level illustrated in FIG. 1A;

FIGS. 2A-8B illustrate various cross-sectional views and respective planar views at intermediate stages of fabrication of the interconnect level illustrated in FIGS. 1A and 1B;

FIG. 9 illustrates a planar view of two photoresist patterns for a double patterning method for forming a rectangular matrix of openings for vias in a substrate, in accordance with some embodiment;

DETAILED DESCRIPTION OF ILLUSTRATIVE EMBODIMENTS

Figure 2B:
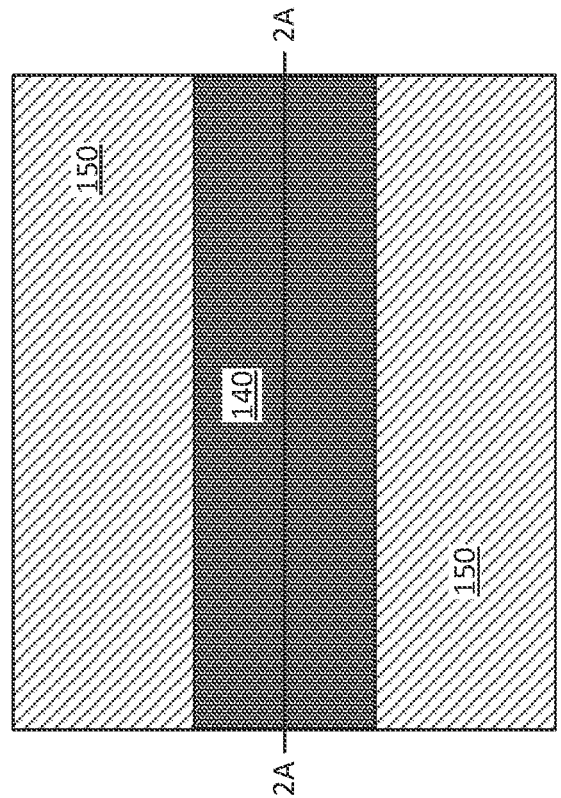

This disclosure describes embodiments of a method related to patterning a substrate using photolithography, where a lithography stack used in a patterning process flow comprises metal-based photoresists. A lithography stack is a stack of sacrificial layers that are used in the processing performed to transfer a pattern of actinic radiation to a layer-to-be-patterned. During IC fabrication, the layer-to-be-patterned is patterned by fabricating patterned etch masks and, with the etch masks, selectively removing material from the layer-to-be-patterned to form the features in the layer, as specified by the IC design. More than one pattern-transfer etching step may be performed, with each pattern-transfer etch using a respective etch mask, in order to complete forming the specified features, as described in further detail below. The etch masks are formed by depositing an unpatterned sacrificial layer of mask material and patterning the layer. In the embodiments of the invented method, a patterned metal-based photoresist layer is used directly as a sacrificial hard mask in a subsequent pattern-transfer etching step used to etch features in the layer-to-be-patterned. In this disclosure, a hard mask is an etch mask for an etching process that selectively removes material from the layer-to-be-patterned. In some instances, a pattern-transfer etching step may use more than one sacrificial hard mask and transfer the superposed pattern to the layer-to-be-patterned. The direct use of the patterned metal-based photoresist layer as the sacrificial hard mask helps reduce processing cost by eliminating the deposition and etching process steps involved in forming a separate hard mask layer of a lithography stack. In this disclosure, a separate hard mask is a hard mask that is not photosensitive; hence, it is not patterned directly by exposing the respective unpatterned layer to a pattern of actinic radiation. Instead, it may be patterned by etching the respective unpatterned layer using a separate patterned masking layer, for example, a patterned photoresist layer.

In some embodiments, the patterned metal-based photoresist layer used directly as a sacrificial hard mask may be part of a patterned bilayer hard mask. For example, in one embodiment, the bilayer hard mask may comprise a metal layer over which the metal-based photoresist layer is formed.

In process flows for manufacturing semiconductor IC's, various layers are deposited and patterned to fabricate electronic devices and interconnect levels in a substrate. In this disclosure, one example embodiment of the direct use of the patterned metal-based photoresist layer as the sacrificial hard mask is described in the context of patterning an interlayer dielectric (ILD) layer of an interconnect level.

FIGS. 1A and 1B illustrate an interconnect level $M_N$ in a cross-sectional view and a planar view, respectively in a substrate 100. As illustrated in FIGS. 1A and 1B, an interconnect level, for example, the interconnect level $M_N$, refers to a network of two types of conductive elements formed in an ILD layer 110, the two types being laterally conducting lines 130 and vertically conducting pillars, referred to as vias 120. The lateral network of conductive lines 130 is embedded in a top portion of the ILD layer 110 and the vias 120 extend through the ILD layer 110, connecting the conductive lines 130 of the interconnect level $M_N$ to the conductive lines 140 of a similar interconnect level $M_{N-1}$. The overlap between the conductive lines 130 and the vias 120 is indicated by a dashed square in the planar view in FIG. 1B. In the cross-sectional view in FIG. 1A, horizontal dashed lines 132 in the overlap region indicate the level of the bottom of the conductive lines 130 and vertical dashed lines 122 indicate the position of the sidewall of the vias 120. The interconnect level $M_{N-1}$, comprising a network of conductive lines 140 and vias (not shown), is formed in a respective ILD layer 150 disposed vertically adjacent below the interconnect level $M_N$.

As known to persons skilled in the art, the interconnect level $M_N$ may be fabricated using a dual-damascene process integration method. In the dual-damascene method, a sequence of process steps is performed. First, the ILD layer 110 comprising a low dielectric constant (low-k) material (e.g., fluorosilicate glass (FSG), carbon-doped oxide (CDO), and porous silicon oxide) is formed using a suitable deposition process (e.g., plasma-enhanced chemical vapor deposition (PECVD)) and planarized using, for example, a chemical-mechanical planarization (CMP) technique. The planarized ILD layer 110 is then patterned to form through holes and trenches in the ILD layer 110 for the vias 120 and the conductive lines 130, respectively. There are broadly two dual-damascene integration approaches to patterning the ILD layer: via-first and trench-first. In the via-first approach, the through holes are formed prior to forming trenches, whereas, in the trench-first approach, the trenches are formed first. After forming the through holes and the trenches, various metallic films are deposited to overfill the openings in the ILD layer 110. Finally, the excess metal is removed from over the ILD layer no by a planarizing etchback process, forming the vias 120 and the conductive lines 130 inlaid in the ILD layer 110.

Patterning a layer often involves performing more than one pattern-transfer step to complete forming all the desired features in the layer-to-be-patterned. After transferring a pattern of actinic radiation to a photoresist layer, the pattern may be transferred again, this time from the patterned photoresist layer to a separate sacrificial hard mask layer. The first pattern transfer is achieved by an exposure step followed by a develop step. During the exposure step, the radiation causes photochemical reactions that alter the etch resistance of the photoresist to etchants in a developer used in the subsequent develop step. During the develop step, the developer removes the exposed photoresist (positive tone resist) or the unexposed photoresist (negative tone resist) to transfer the bright radiation pattern or the dark radiation pattern, thereby forming a patterned photoresist layer. The second pattern transfer is achieved using the patterned photoresist layer as the etch mask during a pattern-transfer etching step that selectively removes material from the separate sacrificial hard mask layer.

A separate hard mask layer is understood to be a layer in a lithography stack comprising a material (or a stack of several materials) suitable for an etch mask during a subsequent etching process but which does not comprise a photosensitive material. A wide variety of materials have been used to form a separate hard mask layer in semiconductor processing including inorganic dielectrics, organic dielectrics, and metallic materials. Examples of materials in a separate hard mask layer include silicon nitride, silicon oxide, silicon carbide, aluminum oxide, amorphous carbon, spin-on carbon (SOC), organic planarizing layer (OPL), titanium, tantalum, titanium nitride, tantalum nitride, tungsten, tungsten silicide, and the like. Some lithography stacks include more than one material layer in the separate hard mask layer to take advantage of the different properties of the materials.

Since the materials for the separate hard mask layer are not photosensitive, the radiation pattern cannot be directly transferred onto the hard mask layer. Instead, the sacrificial hard mask is formed indirectly in a process flow with two pattern-transfer processes and used subsequently for etching the desired features in the layer-to-be-patterned. Despite the extra cost of the added deposition and etching steps, separate hard mask layers are included in the lithography stacks because of their superior robustness and etch resistance over the traditional organic chemically amplified resist (CAR).

An alternative approach is adopted for the embodiments described in this disclosure. The patterning methods using the alternative approach form a simplified lithography stack, in which a metal-based photoresist replaces the traditional organic CAR and a separate hard mask layer. With the separate hard mask layer eliminated, the patterned metal-based photoresist layer serves as the sacrificial hard mask during etching the layer-to-be-patterned. The direct application of the metal-based photoresist layer as the etch mask is enabled by the improved robustness and etch resistance of metal-based photoresists relative to the traditional organic CAR. By adopting this approach, the embodiments in this disclosure reduce processing cost by reducing the number of separate hard mask layers used in a process integration flow for patterning a substrate, as described further below using patterning the ILD layer in a dual-damascene process integration flow as an example.

Process steps for patterning the ILD layer 110 (see FIGS. 1A-1B) in an example dual-damascene flow where a metal-based photoresist layer is used directly as a sacrificial hard mask is described with reference to FIGS. 2A-8B. FIGS. 2A-8B show successive cross-sectional and respective planar views of the substrate 100 as it progresses through a portion of the example dual-damascene flow for fabricating the interconnect level $M_N$ over the interconnect level $M_{N-1}$.

Figure 2A:
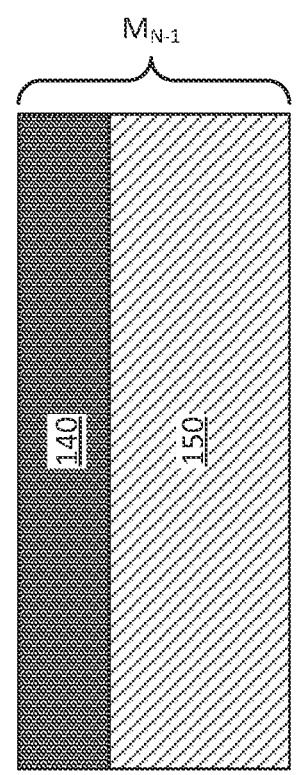

FIGS. 2A and 2B illustrate a cross-sectional and planar view, respectively, of the substrate 100 having the interconnect level $M_{N-1}$, as described above with reference to FIGS. 1A and 1B.

Figure 3B:
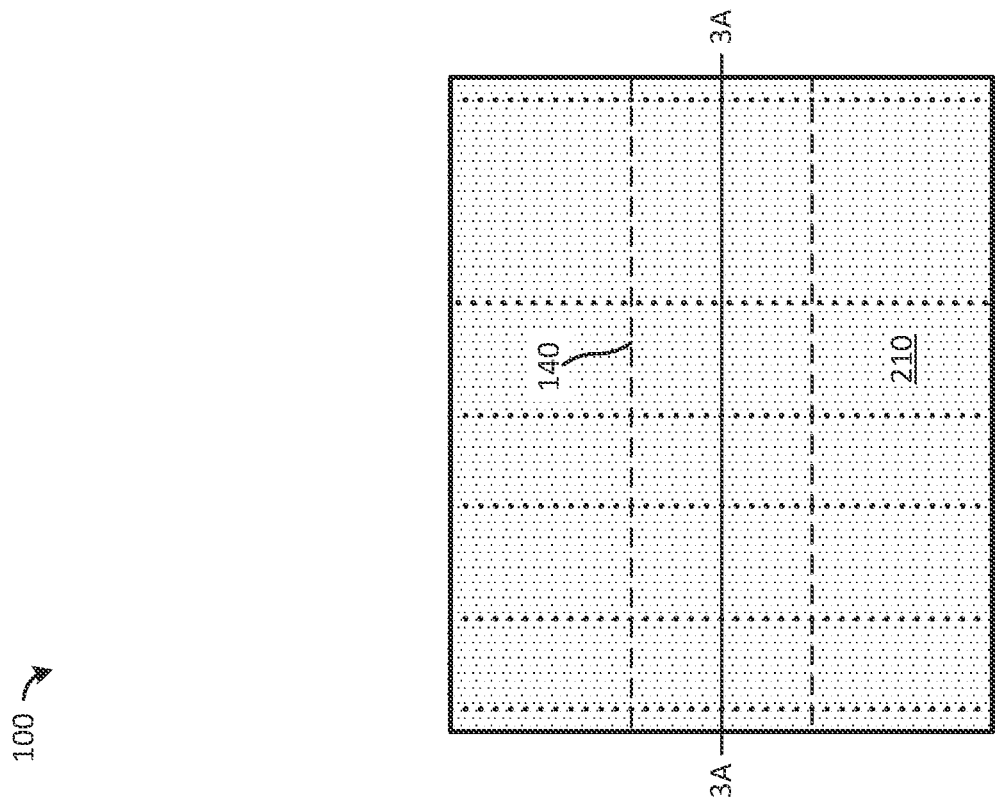
Figure 3A:
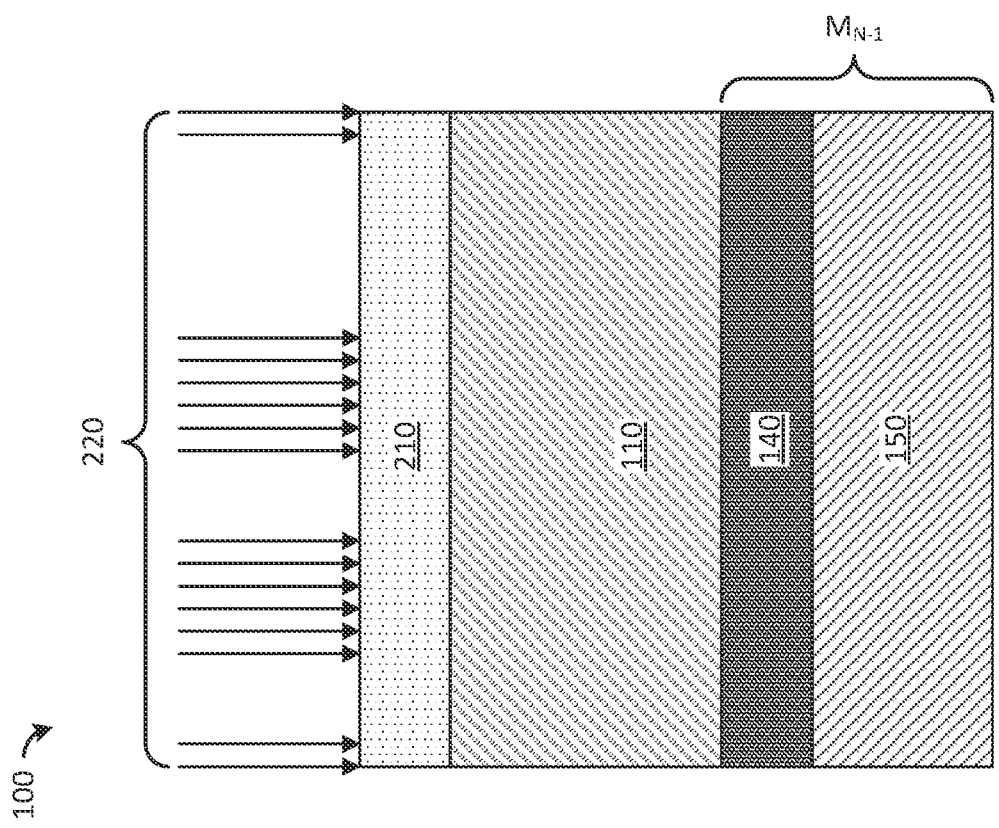

In a cross-sectional and planar view illustrated in FIGS. 3A and 3B, respectively, an unpatterned ILD layer 110 has been formed over the interconnect level $M_{N-1}$, and a metal-based first photoresist layer 210 is formed over the ILD layer 110. In addition to low-k dielectric layers, the ILD layer 110 may include various etch-stop and CMP-stop layers. As illustrated in FIG. 3A, the ILD layer 110 is covered by the metal-based first photoresist layer 210 and exposed to an EUV radiation pattern 220. The metal-based photoresist layer 210 may be formed by spin-coating or by a chemical deposition process using, for example, CVD or PECVD. In some embodiments, a thin adhesive layer may be formed over the ILD layer 110 prior to forming the first photoresist layer 210 over the ILD layer 110. The dashed rectangle in FIG. 3B indicate the position of the conductive line 140 in the interconnect level $M_{N-1}$. The dotted lines indicate the boundaries of features in the EUV radiation pattern 220. In this example embodiment, the first photoresist layer 210 comprises a negative tone photoresist and, accordingly, the EUV radiation pattern (indicated by groups of arrows in FIG. 3A) is the inverse of the trench pattern. In other words, the area exposed to the EUV radiation pattern 220 is the area where no conductive line 130 of the interconnect level $M_N$ (see FIG. 1A), is desired and the unexposed portion of the first photoresist layer 210 in FIG. 3A is the area designated for the conductive lines 130 in FIG. 1A. Hence, the EUV radiation pattern is such that the dark area, which would be removed by etchants in the developer, is the area where trenches are to be etched into the ILD layer 110. In some other embodiment, the first photoresist layer 210 may comprise a positive tone photoresist. In order to achieve the same photoresist pattern using positive tone photoresist, the EUV radiation pattern would have to be the inverse of the radiation patterned in FIG. 3A, that is, the dark area in FIG. 3A would have to be bright and the bright area in FIG. 3A (indicated by the groups of arrows) would have to be dark.

The example pattern depicted in FIG. 3A being a dense pattern, the widths of the bright and dark lines in the EUV radiation pattern 220 in FIG. 3A may be in the range of about 10 nm to about 20 nm. It is understood that, in other areas of the substrate 100, the pattern may comprise wide features. With continued scaling of IC designs, patterning technology at the sub-10 nm nodes is expected to provide interconnect lines at such fine pitch. An EUV lithography system for IC manufacturing provides the capability to simultaneously print feature sizes from about 10 nm to about one micrometer. Using commercially available organic CAR's exposed with a radiation dose of about 20 mJ/cm$^2$ and a high numerical aperture (NA) 193 nm $\lambda$ lithography system, such as NA=1.35, it is possible to resolve resist linewidths of about 40 nm with line width roughness (LWR) of no more than 15% (less than about 6 nm). Multiple patterning techniques may extend the minimum pitch to lower values, but at the cost of larger edge placement error (EPE) and a more complex and expensive process flow. It is generally agreed that state-of-the-art 193 nm $\lambda$ optical systems are not be able to pattern 10 nm to 20 nm features directly, and multi-patterning techniques must be employed at considerable cost. Theoretically, the minimum feature size that may be resolved with an optical system is directly proportional to ($\lambda$/NA). Therefore, the semiconductor industry is deploying 13.5 nm $\lambda$ EUV lithography to pattern critical levels in IC designs for the sub-10 nm technology nodes.

Attempts at developing EUV photoresists by modifying the polymers in traditional organic CAR's had limited success. The performance of photoresists is generally evaluated by three metrics: resolution, line width roughness (LWR), and sensitivity, commonly referred to as the RLS of the photoresist. Resolution is the minimum half-pitch of dense resist lines that can be resolved, LWR is the random variation of linewidth, often expressed as three times the standard deviation (3$\sigma$) of linewidth, and a measure for sensitivity is the radiation dose needed to print dense resist lines, a lower dose signifying higher sensitivity. One issue is that the sensitivity of current organic CAR's for 193 nm $\lambda$ reduces at 13.5 nm $\lambda$, making it difficult to expose the photoresist film with a typical radiation dose of about 20 mJ/cm$^2$. For a fixed radiation dose, the number of EUV photons needed is just 7% of the photons at 193 nm $\lambda$; the incident photon fluence drops from 200 photons/nm$^2$ to just 14 photons/nm$^2$. Moreover, in order to expose the photoresist film uniformly, the film has to be almost transparent to the incident radiation to avoid nonuniformity caused by radiation intensity tapering with depth. Typically, more than 80% of the incident photons pass through the photoresist. On the other hand, increasing the radiation dose means increasing exposure time and increasing manufacturing cost. Given the high cost of EUV scanners and low power output of EUV radiation sources, a total EUV radiation dose exceeding much beyond 50 mJ/cm$^2$ may be unacceptable. The more desirable alternative is to alter the composition of the photosensitive material to enhance the sensitivity of the photoresist to EUV radiation.

Organic photoresists are inherently handicapped to provide high sensitivity and high resolution. Most commercial organic CAR's for 193 nm $\lambda$ are diazonaphthoquinone (DNQ) based polymers composed of carbon, hydrogen, oxygen, and nitrogen atoms. For these elements, the atomic absorption cross-sections at $\lambda$=13.5 nm are relatively low. The sensitivity of organic CAR's may be enhanced by modifying the polymer molecule and increasing the chemical amplification. However, enhancing sensitivity comes at the cost of degrading resolution and LWR. Chemical amplification is derived from photoacid generators (PAG) in organic CAR releasing many photoacid molecules for every photon absorbed. These molecules diffuse and react with protective groups in the backbone of a resist polymer to make it soluble. Rapidly diffusing photoacid molecules and larger polymer molecules enhance the sensitivity to radiation but the opposite is desired for higher resolution and LWR. Long diffusion lengths and larger resist molecules lead to blurring of the edges and degradation of the LWR of resist lines. As a result, the DNQ based organic CAR's have not provided adequate sensitivity and resolution to print resist lines and spaces in the 10 nm to 20 nm range using EUV radiation.

Another hurdle for using organic CAR as an etch mask for EUV lithography is the trend towards thinner photoresist with reducing feature size. Being of a soft and light material, organic CAR's have limited etch resistance and mechanical strength. Accordingly, a relatively thick layer of organic CAR may be needed to compensate for resist loss during a pattern transfer etch to protect the layer being etched using patterned photoresist as the etch mask. However, with resist linewidths reduced to the 10 nm to 20 nm range, the resist thickness gets limited by the increased aspect ratio of resist features. Having limited mechanical strength, tall and narrow lines and pillars of organic CAR may become structurally unstable. For example, consider a pattern of resist lines with unequal spaces on either side, resulting in unequal forces on the two opposite sides due to surface tension of the developer. At a high enough aspect ratio, the force misbalance may bend and even collapse some of the high aspect ratio resist features. Typically, the thicknesses of EUV resist films are selected to be about 35 nm to avoid such patterning defects. This makes it difficult for organic CAR's to provide sufficient protection to be directly used as the etch mask in pattern transfer etches for patterning many of the layers-to-be-patterned to fabricate a semiconductor IC. As described above, additional processing may be performed to transfer the pattern from the patterned photoresist layer to a separate hard mask before transferring the pattern to the layer-to-be-patterned.

In an effort to develop EUV photoresists suitable for high volume manufacturing, researchers have studied the properties of many organic, inorganic, and hybrid photosensitive materials. The hybrid photoresists are found to be best suited as comprehensive performance EUV resists. A hybrid organic-inorganic metal-based photoresists that includes metal atoms in its composition is referred to here as a metal-based photoresist. The inorganic component of the composition provides the high EUV photon absorption property of the photoresist, while the organic component is responsible for the photochemical reactions that alter the photoresist's solubility to the developer solution. The metal-based photoresists alleviate both the problems of resolution-sensitivity tradeoff and low etch resistance of thin photoresist films of organic CAR's described above. The atomic absorption cross-sections of 13.5 nm λ photons for many of the higher atomic number elements are high relative to the absorption cross-sections of EUV photons in carbon, hydrogen, oxygen, and nitrogen. Furthermore, the introduction of inorganic units generally increase the etch resistance of the material. By incorporating metal atoms, the metal-based photoresists have been able to achieve higher sensitivity to EUV radiation, higher etch resistance, and higher mechanical strength, hence better structural stability.

The metal-based photoresist materials may be divided into three broad categories based on their molecular structure. Some of the metal-based photoresist materials are available as a liquid that may be spin-coated over the substrate. Others may be deposited chemically from a precursor gas using a suitable deposition technique such as CVD or PECVD. Wet and/or dry processes are available for forming a metal-based photoresist layer as well as for developing the pattern after exposing the photoresist to an EUV radiation pattern.

One category of metal-based photoresist materials uses an inorganic metal core that comprises a metal nanoparticle or a metal-oxo nanocluster. These photoresists have a molecular structure comprising peripheral organic ligands attached to an inorganic metal core. There is not much distinction between a nanoparticle and a nanocluster. Sometimes, a nanoparticle is referred to as a nanocluster if the unit is small enough for quantum size effects to be observed. Various combinations of organic ligands and metal-oxide cores have been studied, such as oxides of hafnium, zirconium, titanium, tin, zinc, indium, and aluminum. The material properties may be varied by changing the ligand or the inorganic core. For example, because tin-oxo nanoclusters are smaller and more uniformly distributed than hafnium oxide or zirconium oxide nanoparticles, the tin-oxo nanocluster based photoresists may be capable of higher resolution and lower LWR.

Another category of metal-based photoresist materials for EUV lithography uses molecular compounds comprising organometallic complexes, for example, organometallic carboxylate compounds of the form $[R_nM(O_2CR')_2]$, where M denotes a metal atom and R and R' are different functional groups. Metal-based photoresists using organometallic complexes have been investigated for various metals including antimony, tin, bismuth, tellurium, platinum, palladium, cobalt, iron, and chromium.

A third category of metal-based photoresist materials, referred to as hybrid polymeric photoresist, uses polymeric materials, similar to the polymeric resin-based organic CAR's, but incorporates inorganic components to improve EUV photon absorption, etch resistance, and mechanical strength of the polymeric photoresist. Examples of inorganic units incorporated into a polymeric metal-based photoresist include ferrocene, polyoxometalate (e.g., with tungsten or molybdenum atoms), hafnium oxide nanoparticle, and hexafluoroantimonate.

In FIGS. 4A and 4B, the metal-based first photoresist layer 210 has been exposed and developed to transfer the EUV radiation pattern 220 in FIG. 3A to form a patterned metal-based photoresist layer, which is referred to as the first photoresist etch mask 212. After being exposed and developed, the metal-based photoresist material has high etch resistance and high mechanical strength, properties seen generally in metal-based hard masks. Hence, the first photoresist etch mask 212 may be also referred to as the first metal-based hard mask. The cross-sectional view of the substrate 100 illustrated in FIGS. 4A and 4B show the first photoresist etch mask 212 having first through openings 340. As illustrated in FIGS. 4A and 4B, the first through openings 340 expose the region of the ILD layer 110 where the interconnect lines 130 (in FIG. 1) are located.

FIG. 5A illustrates a cross-sectional view of the substrate 100 after a lithography stack 400 has been formed over the first photoresist etch mask 212. The lithography stack 400 comprises a second photoresist etch mask 410 having second through openings 440. In the example embodiment illustrated in FIG. 5A, the lithography stack 400 includes an optional intermediate layer disposed between the first photoresist etch mask 212 and the second photoresist etch mask 410. In FIG. 5A, the intermediate layer comprises a planarizing layer 430 and an underlayer 420 (underlying the second photoresist etch mask 410). Accordingly, the second through openings 440 expose a top surface of the underlayer 420, as seen in FIG. 5A and the respective planar view illustrated in FIG. 5B. As illustrated in FIG. 5A, the planarizing layer 430 fills the first through openings 340 and covers the first photoresist etch mask 212. In the example embodiment illustrated in FIG. 5A, the underlayer 420 has been formed over a substantially planar top surface of the planarizing layer 430.

In some embodiments, the intermediate layer (the layer disposed between the first photoresist etch mask 212 and the second photoresist etch mask 410) may not include the planarizing layer 430 while, in some other embodiments, the underlayer 420 may be omitted. In yet some other embodiments, the lithography stack 400 may comprise simply the second photoresist etch mask 410, the second photoresist etch mask 410 being formed over the first photoresist etch mask 212 without forming the intermediate layer.

The first photoresist etch mask 212 comprises a metal-based photoresist material about 3 nm to about 40 nm thick. In various embodiments, the metal-based photoresist material may be any of the hybrid organic-inorganic resists described above. In various embodiments, the planarizing layer 430 may comprise an organic polymer (referred to as organic planarizing layer (OPL)), spin-on-carbon (SOC), or amorphous carbon. In some embodiments, the underlayer 420 may be a bottom antireflection coating (BARC) and may comprise organic ARC or an inorganic ARC, for example, silicon-rich ARC (SiARC). In various embodiments, the underlayer 420 may include silicon carbide, silicon oxide, low-temperature oxide (LTO), silicon nitride, silicon oxynitride (SiON), or the like or a combination of an antireflection coating and another material (e.g., BARC/LTO or BARC/SiON). In some embodiment, the second photoresist etch mask 410 may comprise a metal-based photoresist, similar to the first photoresist etch mask 212. In some other embodiment, the second photoresist etch mask 410 may comprise an organic CAR.

The second photoresist etch mask 410, illustrated in FIGS. 5A and 5B, is formed by a photolithography technique, where, photoresist is spin-coated or chemically deposited over the top surface of a substrate, the photoresist is exposed to a pattern of actinic radiation, and the exposed photoresist is developed with a developer to transfer the radiation pattern to the photoresist layer. Developing the second photoresist layer completes forming the second photoresist etch mask 410 having a pattern of second through openings 440. As illustrated in FIGS. 5A and 5B, in this example embodiment, the pattern of second through openings 440 expose a portion of the surface of the underlayer 420 that is vertically coincident with the pattern of vias 120 illustrated in FIG. 1.

The optional intermediate layer comprising the planarizing layer 430 and the underlayer 420 serves several purposes. The intermediate layer helps facilitate patterning the second photoresist etch mask 410. As seen in FIGS. 5A and 5B, the planarizing layer 430, typically a flowable material, smoothens out the topography due to the features of the first photoresist etch mask 212. The underlayer 420 may promote adhesion of photoresist and/or suppress reflections. The intermediate layer also helps preserve the pattern integrity of the first photoresist etch mask 212, as explained in further detail below. In addition, as explained below with reference to FIG. 6A, the intermediate layer may function as a separate hard mask layer while etching the ILD layer 110.

During the develop step used to form the second photoresist etch mask 410, the optional intermediate layer blocks the etchants in the developer from diffusing further below into the substrate 100. As mentioned above, in some embodiments, the lithography stack 400 may comprise simply the second photoresist etch mask 410. With no intermediate layer formed between the first photoresist etch mask 212 and the second photoresist etch mask 410, a portion of the first photoresist etch mask 212 may be exposed to the developer while the second photoresist layer is being developed. Although a previously developed photoresist film is very resistant to further etching if exposed to a developer again, there is some risk of creating patterning defects due to double exposure to a developer. To mitigate this risk in embodiments where the lithography stack 400 does not include an intermediate layer, the first photoresist etch mask 212 may undergo a surface treatment prior to forming the second photoresist layer over the first photoresist etch mask 212. The surface treatment may be performed in the lithography track. The treatment may chemically modify the surface to increase etch resistance of the metal-based first photoresist etch mask 212 to the etchants in the developer used subsequently to develop the second photoresist layer to form the second photoresist etch mask 410.

After the second photoresist etch mask 410 has been formed, a first anisotropic etch process using, for example, a reactive ion etch (RIE) technique may be performed to form first openings 442 through the first and the second photoresist etch masks, as illustrated in the cross-sectional view in FIG. 6A. As illustrated in the cross-sectional view in FIG. 6A and the respective planar view illustrated in FIG. 6B, the first anisotropic etch process extends each of the first openings 442 through the ILD layer 110 to expose a portion of a conductive line 140 in the interconnect level $M_{N-1}$.

During an initial part of the anisotropic etch process, the second through openings 440 are extended through the underlayer 420 into the planarizing layer 430 by selectively removing material from the underlayer 420 and the planarizing layer 430 using the second photoresist etch mask 410 as the masking layer. This transfers the pattern of the second photoresist etch mask 410 to the intermediate layer and continues to remove material from planarizing layer 430.

In the example illustrated in FIGS. 5A-5B and 6A-6B, none of the second through openings 440 extends laterally to have a portion of the opening located vertically above a photoresist line of the first photoresist etch mask 212. In some other embodiment, the mask patterns may be such that the lateral extension of some second through opening 440 has a portion that is disposed vertically over a photoresist line of the first photoresist etch mask 212. Then the anisotropic etching may vertically extend the second through opening 440 to expose the portion of the photoresist line of the first photoresist etch mask 212 located vertically below the second through opening 440. However, the metal-based photoresist material and the etch chemistry may be selected such that the first photoresist etch mask 212 has relatively high etch resistance. The resist loss from the exposed portion of the first photoresist etch mask 212 may be small enough for there to be sufficient thickness of metal-based photoresist to protect the portion of the ILD layer 110 covered by the photoresist lines of the first photoresist etch mask 212. Material may continue to be removed by the anisotropic etching process to form the first openings 442 but mostly from a region vertically overlapping both the first through openings 340 and the second through openings 440. In the embodiment illustrated in FIG. 6A, the first openings 442 extend through the ILD layer 110 until a portion of the conductive lines 140 of the interconnect level $M_{N-1}$ is exposed.

The second photoresist etch mask 410 may comprise a metal-based photoresist or an organic CAR. The resist thickness may suffice transferring the pattern of second through openings 440 to the intermediate layer. But, in some embodiments, such as in the example illustrated in FIG. 6A, the resist thickness may not be sufficient for the second photoresist etch mask 410 to survive the entire duration of the anisotropic etching process. The second photoresist etch mask 410 may be completely removed before the first openings 442 extend through the ILD layer 110 to expose a portion of the conductive lines 140. This is more likely to occur for embodiments using organic CAR, since the resist loss is relatively high. However, after the pattern is transferred from the second photoresist etch mask 410 to the intermediate layer, the intermediate layer, comprising the underlayer 420 and the planarizing layer 430, may function as a separate hard mask layer in the lithography stack 400 (see FIG. 5A). Indeed, the cross-sectional view of the substrate 100 after the first openings 442 have been formed (illustrated in FIG. 6A) shows that, in this example, the first anisotropic etch process has removed the second photoresist etch mask 410, the underlayer 420, and a portion of the planarizing layer 430.

A comparison of the structure after the first openings 442 are formed (FIG. 6A) with the structure of the substrate 100 after the interconnect level $M_N$ is formed (FIG. 1A) shows that, in this example dual-damascene flow, the first openings 442 define the locations of the vias 120 of the interconnect level $M_N$. Accordingly, the first anisotropic etch process used to form the first openings 442 may be referred to as a via-open etch step.

FIGS. 7A and 7B illustrate a cross-sectional view and a planar view of the substrate 100 after the portion of the first lithography stack 400 remaining at the end of the first anisotropic etch process has been removed and second openings 342 have been formed.

The second openings 342 may be formed by performing a second anisotropic etch process with the first photoresist etch mask 212 used as the etch mask to extend the first through openings 340 into the ILD layer 110. The second anisotropic etch process may be using an RIE technique with a suitable etch chemistry to selectively remove material from the ILD layer 110, forming second openings 342 having a bottom surface formed at a depth less than a thickness of the ILD layer 110. It is noted that there may be negligible resist loss during the second anisotropic etch process because metal-based photoresists have high etch resistance. Accordingly, the first photoresist etch mask 212, may be used directly as the sacrificial hard mask. This allows for a simplified dual-damascene process flow, achieved by eliminating the processing steps that would otherwise be performed to memorize the pattern of the first through openings 340 onto a separate hard mask layer.

A comparison of the structure after the first openings 442 are formed (FIGS. 7A and 7B) with the structure of the substrate wo after the interconnect level $M_N$ is formed (FIGS. 1A and 1B) shows that, in this example dual-damascene flow, the second openings 342 define the locations of the conductive lines 130 of the interconnect level $M_N$. Accordingly, the second anisotropic etch process used to form the first openings 442 may be referred to as a trench-open etch step.

FIGS. 8A and 8B illustrate a cross-sectional view and a planar view of the substrate 100 after the second anisotropic etch process is complete and the first photoresist etch mask 212 has been removed. The metal-based first photoresist etch mask 212 may be removed using, for example, a dry etch process using plasma comprising process and carrier gases including hydrogen bromide, hydrogen, argon, nitrogen, helium, chlorine, and the like. The outlines of the portion of the ILD layer 110 visible at the bottom of the second openings 342 are indicated by dotted lines in FIG. 8B. Removing the first photoresist etch mask 212 completes the patterning of the ILD layer 110 in the example dual damascene flow. Since the first openings 442, intended for vias 120, are formed prior to forming the second openings 342, intended for the conductive lines 130, the example dual damascene flow may be referred to as a via-first dual damascene flow.

After patterning the ILD layer 110 is completed, the example dual damascene flow proceeds to complete forming the interconnect level $M_N$. The first openings 442 and the second openings 342 are filled with conductive materials, for example, a titanium nitride liner and a copper fill material, using suitable deposition techniques such as PECVD and electrochemical deposition (ECD). Typically, the first openings 442 and the second openings 342 are overfilled, and the excess conductive material is removed from over the ILD layer 110 using a suitable etchback process (e.g., metal CMP), forming the vias 120 and the conductive lines 130 inlaid in the ILD layer 110 (as illustrated in FIGS. 1A and 1B).

In the example via-first dual damascene flow described above with reference to FIGS. 1A-8B, two photoresist etch masks (the first photoresist etch mask 212 and the second photoresist etch mask 410) have been used to pattern the ILD layer 110 to form openings for both the vias 120 and the conductive lines 130 of the interconnect level $M_N$. The patterned features in the ILD layer 110 have been achieved by using two anisotropic etch processes; the first anisotropic etch process forming the first openings 442 (for forming vias 120) and the second anisotropic etch process forming the second openings 342 (for forming the conductive lines 130).

Figure 10:
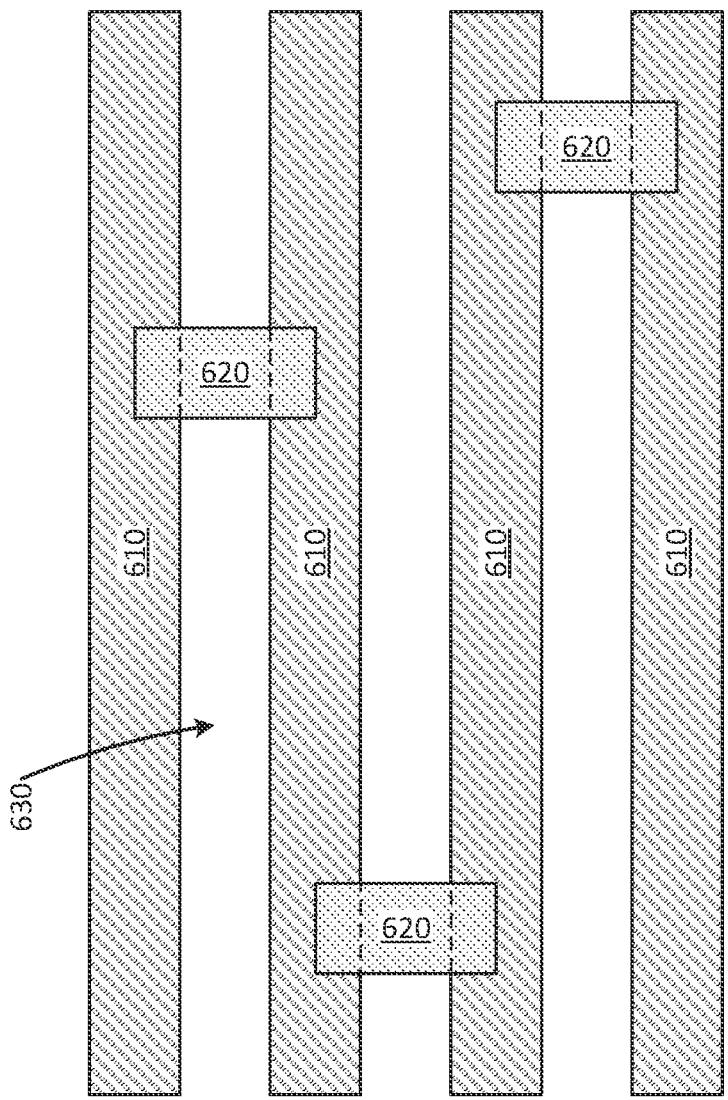
FIG. 10 illustrates a planar view of two photoresist patterns for a double patterning method for forming trenches in a substrate, in accordance with some embodiment.

The method of directly using metal-based photoresist etch masks may provide the advantage of reducing the processing cost of some double-patterning flows. In the example double-patterning flows, a single pattern transfer etch is performed with two superposed etch masks to pattern features in a layer-to-be-patterned. The cost reduction is achieved by simplifying the lithography stack, similar to the cost reduction achieved in the via-first dual-damascene flow described above. Two example embodiments of double-patterning are described below with reference to FIGS. 9 and 10, respectively. FIG. 9 illustrates a double patterning technique to form contact holes in a dielectric layer, and FIG. 10 illustrates a double patterning technique to form trenches in a trench-first dual-damascene flow.

FIG. 9 illustrates a planar view of two photoresist patterns for a double patterning method for forming a rectangular matrix of contact holes in a dielectric layer. In FIG. 9, a second photoresist pattern of a second photoresist etch mask is superposed over a first photoresist pattern of a first photoresist etch mask. The pattern for the first photoresist etch mask comprises first photoresist lines 510, drawn parallel to the X-direction, the first through openings being the spaces between adjacent first photoresist lines 510. Superposed over the first photoresist lines 510, is the pattern of the second photoresist etch mask comprising second photoresist lines 520, drawn parallel to the Y-direction, the second through openings being the spaces between adjacent second photoresist lines 520. Although, in the embodiment illustrated in FIG. 9, the second photoresist lines 520 are drawn perpendicular to the first photoresist lines 510, it is understood that some other angle may be selected. The dashed lines in FIG. 9 indicate the outlines of a portion of the first photoresist lines 510 that is covered by the second photoresist lines 520.

The double-patterning process flow mimics the example dual-damascene process, described above with reference to FIGS. 2A-8B. The metal-based first photoresist etch mask comprising first through openings is formed over the dielectric layer to be patterned. The layer-to-be-patterned may comprise silicon oxide or a low-k dielectric (e.g., CDO, FSG, and porous oxide) and may include multiple dielectric layers, including silicon nitride, silicon carbide, and the like. A lithography stack comprising the second photoresist etch mask is formed over the first photoresist etch mask. The second photoresist mask comprises second through openings. In some embodiment, the second photoresist etch mask may comprise a metal-based photoresist. In some other embodiment, the second photoresist etch mask may comprise an organic CAR.

After both the first and the second photoresist etch masks have been formed, an anisotropic etch process is performed to form first openings 530 in a region that vertically overlaps both the first through openings and the second through openings, as illustrated in FIG. 9. Similar to the first openings 442 (see FIGS. 6A and 6B), each first opening 530 extends through the dielectriclayer-to-be-patterned to expose a portion of a conductive layer below the dielectric layer. The first openings 530 are contact holes intended for forming contacts to an electrode of an electronic component, such as a transistor, capacitor, or resistor. Accordingly, the portion of the conductive layer exposed by the first openings 530 may be a portion of the electrode or electrically coupled to the electrode. For example, the electrode exposed by a contact hole may be a source/drain of a transistor, a metal gate of a transistor, or an extension of the metal gate over an isolation region between adjacent transistors. After forming the first openings 530, the remaining material of the lithography stack comprising the second photoresist lines 520 is removed, similar to removing the lithography stack 400 in the example via-first dual damascene flow, as mentioned with reference to FIGS. 7A and 7B. However, unlike in the example via-first dual damascene flow, in the double-patterning process flow, the first lithography etch mask comprising the first photoresist lines 510 is also removed. The double-patterning process flow does not include forming second openings using a second anisotropic etch prior to removing the first lithography etch mask.

Another example of a double-patterning flow where processing cost may be reduced by direct use of a metal-based photoresist etch mask is a trench-first dual-damascene flow. In this example, a double-patterning technique using a pair of photoresist etch masks is applied to create a block pattern to support an aggressive tip-to-tip design rule. FIG. 10 illustrates a planar view of two photoresist patterns for a double patterning method for forming trenches in a substrate. FIG. 10 illustrates a first pattern of photoresist lines 610 for the first photoresist etch mask and a second pattern of photoresist blocks 620 for the second photoresist etch mask superposed over the first pattern of photoresist lines 610. The outline of the photoresist lines 610 covered by the photoresist blocks 620 are indicated by dashed lines in FIG. 10. The spaces between adjacent photoresist lines 610 are the first through openings, and the area not covered by the photoresist blocks 620 are the second through openings. The first openings 630 formed through the first and the second photoresist etch masks are located in the ILD layer in a region that vertically overlaps both the first through openings and the second through openings.

Similar to the dual-patterning flow for patterning contacts (described above with reference to FIG. 9), in the dual-patterning flow for patterning trenches, both the first photoresist etch mask and the second photoresist etch mask are removed after the first openings 630 are formed by an anisotropic etch process. The first openings 630 are trenches having a bottom surface formed at a depth less than a thickness of the ILD layer and are intended for forming conductive lines of the respective interconnect level. The double patterning technique using the first pattern of photoresist lines 610 and the second pattern of photoresist blocks 620 helps support a smaller tip-to-tip spacing In the trench-first dual-damascene flow, the metal interconnect level is formed using a standard dual-damascene method. After the trenches have been formed, holes extending through the ILD layer are patterned for forming vias. Each hole for the vias exposes a portion of a surface of a conductive line of the interconnect level below the ILD layer. The holes for vias and the trenches for conductive lines are filled with conductive material and a suitable etchback process (e.g., metal CMP) is performed to form vias and conductive lines inlaid in the ILD layer of the respective interconnect level.

FIGS. 11A-11D illustrate various cross-sectional views at intermediate stages of a process flow for patterning an unpatterned metal layer 710 of a substrate 700. This is another example embodiment of the method of directly forming a sacrificial hard mask for patterning a layer of a substrate by exposing and developing a metal-based photoresist layer.

Figure 11A:
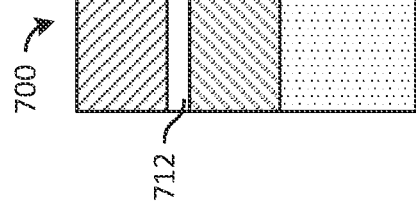
FIGS. 11A-11D illustrate various cross-sectional views at intermediate stages of a process flow for patterning an unpatterned metal layer of a substrate, in accordance with some embodiment.

In this embodiment, the layer-to-be-patterned is an unpatterned metal layer 710 of substrate 700 disposed over a substrate layer 702, for example, an ILD layer, as illustrated in a cross-sectional view in FIG. 11A of a substrate 700. FIG. 11A also shows a thin interfacial layer 712 covering the surface of the unpatterned metal layer 710. The thin interfacial layer 712 is an optional layer comprising a conductive material selected to promote adhesion with the first photoresist layer 720 as well as to protect the unpatterned metal layer 710 from corrosion and oxidation when exposed to an ambient such as air. In various embodiments, the thin interfacial layer 712 may comprise silicon, silicon nitride, titanium nitride, or tantalum nitride having a thickness from about 0.5 nm to about 5 nm, typically about 1 nm.

The unpatterned metal layer 710 may comprise metals such as ruthenium or molybdenum having a thickness of about 20 nm to about 60 nm, in various embodiments. As known to a person skilled in the art, it is challenging to pattern relatively thick separate hard masks to etch metals such as ruthenium and molybdenum, particularly pattern dense features having the fine pitch used in IC designs at sub-10 nm nodes. The difficult issue of patterning separate hard masks may be avoided by using a metal-based patterned photoresist directly as the metal hard mask. For example, hybrid metal-based photoresists using tin-oxo nanoclusters may be used directly as the metal hard mask to etch ruthenium because patterned tin-oxo nanocluster based photoresists as the inorganic core are resistant to plasma etching in oxygen-containing plasma chemistries that may be used to etch ruthenium. Hybrid organic-inorganic photoresists based on tin-oxo nanoclusters are also resistant to fluorine based etch chemistries that may be used to etch other metals such as molybdenum.

Figure 11B:
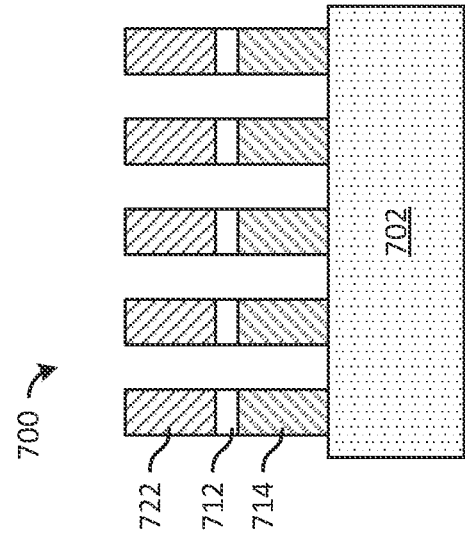

FIG. 11B illustrates a cross-sectional view of the substrate 700 after a first photoresist layer 720 comprising a metal-based photoresist material has been formed over the unpatterned metal layer 710. Any of the hybrid metal-based photoresist materials described above may be used for patterning the metal layer 710. However, a specific metal-based photoresist may be selected for a high selectivity to the etch chemistry that is selected to etch the metal layer 710. In some embodiments, the first photoresist layer 720 may be a negative tone photoresist. In other embodiments, the first photoresist layer 720 may be a positive tone photoresist.

Figure 11C:
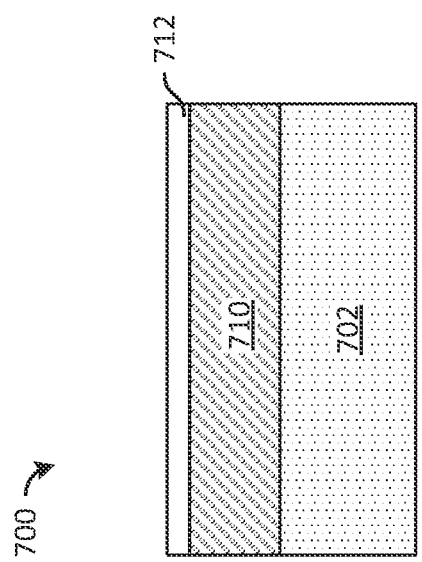

In FIG. 11C the metal-based first photoresist layer 710 has been exposed to a pattern of EUV radiation and developed to form a patterned metal-based hard mask 722.

Figure 11D:
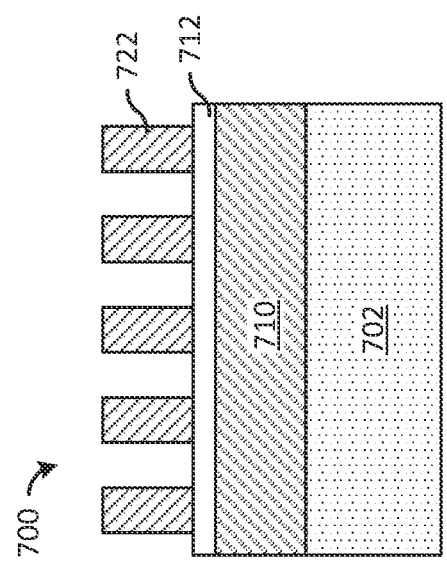

In FIG. 11D, the unpatterned metal layer 710 has been etched using a suitable etching technique such as wet etching, dry etching, and RIE to form a patterned metal layer 714. The etching process exposes the substrate 700 to etchants such as oxygen, ozone, chlorine, and fluorine. The etchant selectively removes material from a portion of the unpatterned metal layer 710 that is exposed to the etchant. In the example embodiment illustrated in FIG. 11D, the pattern of the first metal-based hard mask 722 has been transferred onto the patterned metal layer 714 by performing an anisotropic etch, the etch stopping on the substrate layer 702 below the patterned metal layer 714. The first metal-based hard mask 722 and the optional thin interfacial layer 712 are sacrificial layers. After the patterned metal layer 714 has been formed, generally, the first metal-based hard mask 722 and the optional thin interfacial layer 712 are removed using, for example, a non-oxygen containing dry etch process for selective removal of the resist and a selective wet etch process to remove the interfacial layer.

In the embodiment described above with reference to FIGS. 11D, the unpatterned metal layer 710 has been patterned using one metal-based hard mask 722. In some other embodiment, the unpatterned metal layer 710 may be patterned using a double patterning technique, referred to as litho-freeze-litho-etch (LFLE). The LFLE double patterning technique comprises forming two etch masks prior to etching the layer-to-be-patterned. The LFLE double patterning technique may also be used in an embodiment using patterned metal-based photoresist layers directly as sacrificial hard masks for patterning a layer of a substrate. In such an embodiment, prior to etching the unpatterned metal layer, a second metal-based photoresist layer may be formeded over the surface of the substrate 700. The second photoresist layer (formed over the first metal-based hard mask 722) may be exposed to a second pattern of EUV radiation and developed, forming a second metal-based hard mask over the first metal-based hard mask 722. After the second metal-based hard mask has been formed over the first metal-based hard mask 722 the etch process to pattern the unpatterned metal layer 710 may be performed.

In some embodiments using the LFLE double patterning technique described above, prior to forming the second photoresist layer over the first metal-based hard mask, a surface treatment (sometimes referred to as freezing) may be performed. The surface treatment may chemically modify the surface to increase an etch resistance of the first metal-based hard mask 722 to a developer used subsequently for developing the exposed second photoresist layer.

In some other embodiments using double patterning, an intermediate layer (similar to that described above with reference to FIG. 5A) may be formed over the first metal-based hard mask 722 prior to forming the second photoresist layer over the first metal-based hard mask.

Figure 12:
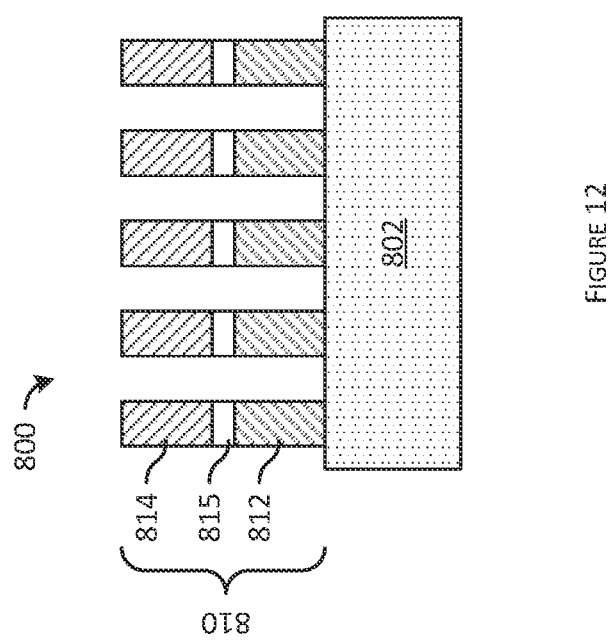
FIG. 12 illustrates a cross-sectional view of a bilayer hard mask, in accordance with some embodiment.

Yet another embodiment of the method of directly using a patterned metal-based photoresist layer as a sacrificial hard mask is a patterned bilayer hard mask comprising a metal layer and a first metal-based photoresist layer over the metal layer, illustrated in a cross-sectional view of a substrate 800 in FIG. 12.

As illustrated in FIG. 12, the bilayer hard mask 810 comprises a metal layer 812 and a first metal-based photoresist layer 814 over the metal layer 812. The bilayer hard mask 810 has been formed over a layer-to-be-patterned 802 of the substrate 800. The layer-to-be-patterned 802 may be, for example, an ILD layer, similar to the ILD layer 110 described above with reference to FIGS. 1A and 1B. In the example embodiment illustrated in FIG. 12, the bilayer hard mask 810 includes an optional thin adhesion layer 815 disposed adjacent below the first metal-based photoresist layer 814. If included, the thin adhesion layer 815 may comprise, for example, organic BARC having a thickness of about 2 nm to about 10 nm. In some other embodiment, the bilayer hard mask 810 may not include the thin adhesion layer 815. Any of the hybrid organic-inorganic photoresist materials described above may be used in forming the first metal-based photoresist layer 814. In some embodiments, the metal layer 812 comprises ruthenium, tungsten silicide, or tungsten carbide and the thickness may vary from about 1 nm to about 10 nm. In one embodiment, the metal layer 812 comprises ruthenium and the first metal-based photoresist layer 814 comprises a tin-oxo nanocluster based photoresist. In various embodiments, the metal layer 812 may comprise some other metal that is a good absorber of EUV radiation, such as tin, nickel, or various metal alloys comprising metals that have a high capture cross-section for EUV photons.

The patterned bilayer hard mask 810 may be formed over the layer-to-be-patterned 802 by depositing the metal layer 812 over the layer-to-be-patterned 802, forming the thin adhesion layer 815 over the metal layer 812, and patterning the metal layer 812 using an EUV lithography technique, where the photoresist etch mask is the first metal-based photoresist layer 814. The EUV lithography technique for patterning the metal layer 812 is similar to the method for patterning the unpatterned metal layer 710 described with reference to FIGS. 11A-11D.

After forming the bilayer hard mask 810, the layer-to-be-patterned 802 may be etched using the bilayer hard mask 810 by exposing the substrate to an etchant, the etchant selectively removing a portion of the layer-to-be-patterned 802 that is exposed to the etchant.

In some embodiments, a lithography stack, similar to the lithography stack 400 (described with reference to FIG. 5A), may be formed prior to etching the layer-to-be-patterned 802. The lithography stack may comprise an intermediate layer and a second metal-based hard mask over the intermediate layer. In some embodiments, the intermediate layer comprises a planarizing layer (e.g., OPL, SOC, or amorphous carbon).

In this disclosure, we have described several embodiments for patterning a substrate, where the sacrificial hard mask used in pattern transfer etches to pattern the substrate has been formed directly from a metal-based photoresist. Using these embodiments, provides the advantage of simplifying the lithography stack in various process flows by eliminating a separate hard mask layer, thereby eliminating the deposition and etching processes that would have been performed to fabricate a separate sacrificial hard mask layer as the etch mask for patterning the layer-to-be-patterned.

Example 1. A method for patterning a substrate includes: forming a first photoresist etch mask with an extreme ultraviolet (EUV) lithography process, the first photoresist etch mask including first through openings, the first photoresist etch mask including a metal-based photoresist material; forming a second photoresist etch mask over the first photoresist etch mask, the second photoresist etch mask including second through openings; and forming first openings, through the first and the second photoresist etch masks, in a region of the substrate that vertically overlaps both the first through openings and the second through openings.

Example 2. The method of example 1, where forming the second photoresist etch mask includes: forming a major surface of the substrate with a second photoresist layer, the second photoresist layer including a metal-based photoresist material; and exposing the second photoresist layer to a pattern of EUV radiation and developing the exposed second photoresist layer.

Example 3. The method of one of examples 1 or 2, further including: forming an intermediate layer after forming the first photoresist etch mask, the second photoresist etch mask being formed over the intermediate layer.

Example 4. The method of one of examples 1 to 3, where forming the intermediate layer includes: forming a planarizing layer, the second photoresist etch mask being formed over the planarizing layer.

Example 5. The method of one of examples 1 to 4, where forming the planarizing layer includes forming an organic planarizing layer (OPL), a spin-on-carbon (SOC) layer, or an amorphous carbon layer.

Example 6. The method of one of examples 1 to 5, where forming the intermediate layer includes: forming an underlayer, the second photoresist etch mask being formed over the underlayer.

Example 7. The method of one of examples 1 to 6, where forming the underlayer includes forming a layer including an organic bottom antireflection coating (BARC), a silicon-rich antireflection coating (SiARC), a silicon oxide layer, a silicon carbide layer, or a combination thereof.

Example 8. The method of one of examples 1 to 7, further including: after forming the first openings, removing the second photoresist etch mask and the intermediate layer; and after removing the second photoresist etch mask and the intermediate layer, forming second openings in a region of the substrate exposed by the first photoresist etch mask.

Example 9. The method of one of examples 1 to 8, where the substrate includes an interlayer dielectric (ILD) layer disposed over a conductive layer; where forming the first openings in the substrate includes forming a plurality of holes extending through the ILD layer, each of the plurality of holes exposing a portion of a surface of the conductive layer; and where forming the second openings in the substrate includes forming trenches in the ILD layer, the trenches having a bottom surface formed at a depth less than a thickness of the ILD layer.

Example 10. The method of one of examples 1 to 9, further including: filling the plurality of holes and the trenches with conductive material, the filling forming an interconnect level in the ILD layer, the interconnect level being a lateral network of conductive lines connected by conductive vias to another vertically adjacent interconnect level.

Example 11. The method of one of examples 1 to 10, further including: removing the first and the second photoresist etch masks after forming the first openings.

Example 12. The method of one of examples 1 to 11, where the substrate includes a dielectric layer disposed over a conductive layer, and where forming the first openings in the substrate includes forming a plurality of holes extending through the dielectric layer, each of the plurality of holes exposing a portion of a surface of the conductive layer.

Example 13. The method of one of examples 1 to 12, where the substrate includes an interlayer dielectric (ILD) layer disposed over a conductive layer, and where forming the first openings in the substrate includes forming trenches in the ILD layer, the trenches having a bottom surface formed at a depth less than a thickness of the ILD layer.

Example 14. The method of one of examples 1 to 13, further including: removing the first and the second photoresist etch masks after forming the first openings; after removing the first and the second photoresist etch masks, forming a plurality of holes extending through the ILD layer, each of the plurality of holes exposing a portion of a surface of the conductive layer; and filling the plurality of holes and the trenches with conductive material, the filling forming an interconnect level in the ILD layer, the interconnect level being a lateral network of conductive lines connected by conductive vias to another vertically adjacent interconnect level.

Example 15. The method of one of examples 1 to 14, where the metal-based photoresist includes a metal oxide nanoparticle, the metal including hafnium, zirconium, titanium, tin, zinc, indium, or aluminum; where the metal-based photoresist includes a tin-oxo nanocluster; or where the metal-based photoresist includes an organometallic complex, the metal being antimony, tin, bismuth, tellurium, platinum, palladium, cobalt, iron, or chromium.

Example 16. A method for patterning an unpatterned metal layer of a substrate includes: forming a first photoresist layer over the unpatterned metal layer, the first photoresist layer including a first metal-based photoresist material disposed over the unpatterned metal layer; forming a first metal-based hard mask directly from the first photoresist layer by exposing the first photoresist layer to a pattern of EUV radiation and developing the exposed first photoresist layer; and after forming a first metal-based hard mask, etching the unpatterned metal layer by exposing the substrate to an etchant, the etching selectively removing a portion of the unpatterned metal layer that is exposed to the etchant.

Example 17. The method of example 16, further including: prior to etching the unpatterned metal layer, performing a sequence of process steps, the sequence including: forming a second photoresist layer over the first metal-based hard mask, the second photoresist layer including a second metal-based photoresist material; and forming a second metal-based hard mask directly from the second photoresist layer by exposing the second photoresist layer to a pattern of EUV radiation and developing the exposed second photoresist layer.

Example 18. The method of one of examples 16 or 17, further including: prior to forming the second photoresist layer over the first metal-based hard mask, performing a surface treatment, the surface treatment chemically modifying the surface to increase an etch resistance of the first metal-based hard mask to a developer used subsequently for developing the exposed second photoresist layer.

Example 19. The method of one of examples 16 to 18, where the unpatterned metal layer includes ruthenium or molybdenum, where the first metal-based photoresist material includes a tin-oxo nanocluster, and where the second metal-based photoresist material includes a tin-oxo nanocluster.

Example 20. The method of one of examples 16 to 19, further including: prior to forming the first photoresist layer over the unpatterned metal layer, forming a thin adhesion layer over the unpatterned metal layer.

Example 21. The method of one of examples 16 to 20, where the thin adhesion layer includes silicon, silicon nitride, titanium nitride or tantalum nitride, and where a thickness of the thin adhesion layer is greater than or equal to 0.5 nm and less than or equal to 5 nm.

Example 22. A method for patterning a layer-to-be-patterned in a substrate includes: forming, using a EUV lithography process, a patterned bilayer hard mask including a metal layer and a first metal-based photoresist layer over the metal layer, the bilayer hard mask being formed over the layer-to-be-patterned; and etching the layer-to-be-patterned by exposing the substrate to an etchant, the etching selectively removing a portion of the layer-to-be-patterned that is exposed to the etchant.

Example 23. The method of example 22, where the patterned bilayer hard mask further includes an adhesion layer, the adhesion layer being formed adjacent below the first metal-based photoresist layer.

Example 24. The method of one of examples 22 or 23, where the adhesion layer includes organic bottom antireflection coating (BARC), where the metal layer includes ruthenium, tungsten silicide, or tungsten carbide.

Example 25. The method of one of examples 22 to 24, further including: prior to etching the layer-to-be-patterned, forming an intermediate layer over the patterned bilayer hard mask; and forming a second metal-based hard mask over the intermediate layer, where forming the second metal-based hard mask includes: forming a second photoresist layer over the intermediate layer, the second photoresist layer including a second metal-based photoresist material; and exposing the second photoresist layer to a pattern of EUV radiation and developing the exposed second photoresist layer.

Example 26. The method of one of examples 22 to 25, where forming the intermediate layer includes forming a planarizing layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for patterning a substrate, the method comprising:
   forming a first photoresist etch mask with an extreme ultraviolet (EUV) lithography process, the first photoresist etch mask comprising first through openings, the first photoresist etch mask comprising a metal-based photoresist material;
   forming a second photoresist etch mask over the first photoresist etch mask, the second photoresist etch mask comprising second through openings; and
   forming first openings, through the first and the second photoresist etch masks, in a region of the substrate that vertically overlaps both the first through openings and the second through openings.

2. The method of claim 1, wherein forming the second photoresist etch mask comprises:
   forming a major surface of the substrate with a second photoresist layer, the second photoresist layer comprising a metal-based photoresist material; and
   exposing the second photoresist layer to a pattern of EUV radiation and developing the exposed second photoresist layer.

3. The method of claim 1, further comprising:
   forming an intermediate layer after forming the first photoresist etch mask, the second photoresist etch mask being formed over the intermediate layer.

4. The method of claim 3, wherein forming the intermediate layer comprises:
   forming a planarizing layer, the second photoresist etch mask being formed over the planarizing layer.

5. The method of claim 3, wherein forming the intermediate layer comprises:
   forming an underlayer, the second photoresist etch mask being formed over the underlayer.

6. The method of claim 3, further comprising:
   after forming the first openings, removing the second photoresist etch mask and the intermediate layer; and
   after removing the second photoresist etch mask and the intermediate layer, forming second openings in a region of the substrate exposed by the first photoresist etch mask.

7. The method of claim 6,
   wherein the substrate comprises an interlayer dielectric (ILD) layer disposed over a conductive layer;
   wherein forming the first openings in the substrate comprises forming a plurality of holes extending through the ILD layer, each of the plurality of holes exposing a portion of a surface of the conductive layer; and
   wherein forming the second openings in the substrate comprises forming trenches in the ILD layer, the trenches having a bottom surface formed at a depth less than a thickness of the ILD layer.

8. The method of claim 7, further comprising:
   filling the plurality of holes and the trenches with conductive material, the filling forming an interconnect level in the ILD layer, the interconnect level being a lateral network of conductive lines connected by conductive vias to another vertically adjacent interconnect level.

9. The method of claim 1, further comprising:
   removing the first and the second photoresist etch masks after forming the first openings.

10. The method of claim 1,
    wherein the substrate comprises a dielectric layer disposed over a conductive layer, and
    wherein forming the first openings in the substrate comprises forming a plurality of holes extending through the dielectric layer, each of the plurality of holes exposing a portion of a surface of the conductive layer.

11. The method of claim 1,
    wherein the metal-based photoresist comprises a metal oxide nanoparticle, the metal comprising hafnium, zirconium, titanium, tin, zinc, indium, or aluminum.

12. The method of claim 1,
    wherein the metal-based photoresist comprises a tin-oxo nanocluster, OR
    wherein the metal-based photoresist comprises an organometallic complex, the metal being antimony, tin, bismuth, tellurium, platinum, palladium, cobalt, iron, or chromium.

13. The method of claim 1, wherein the second photoresist etch mask comprises a photoresist material.

14. A method for patterning an unpatterned metal layer of a substrate, the method comprising:
    forming a first photoresist layer over the unpatterned metal layer, the first photoresist layer comprising a first metal-based photoresist material disposed over the unpatterned metal layer;
    forming a first metal-based hard mask directly from the first photoresist layer by exposing the first photoresist layer to a pattern of extreme ultraviolet (EUV) radiation and developing the exposed first photoresist layer;
    after forming a first metal-based hard mask, etching the unpatterned metal layer by exposing the substrate to an etchant, the etching selectively removing a portion of the unpatterned metal layer that is exposed to the etchant; and
    prior to etching the unpatterned metal layer,
       forming a second photoresist layer over the first metal-based hard mask, the second photoresist layer comprising a second metal-based photoresist material, and
       forming a second metal-based hard mask directly from the second photoresist layer by exposing the second photoresist layer to a pattern of EUV radiation and developing the exposed second photoresist layer.

15. The method of claim 14, further comprising:

prior to forming the first photoresist layer over the unpatterned metal layer, forming a thin adhesion layer over the unpatterned metal layer.

16. The method of claim 15, wherein the thin adhesion layer comprises silicon, silicon nitride, titanium nitride or tantalum nitride, and wherein a thickness of the thin adhesion layer is greater than or equal to 0.5 nm and less than or equal to 5 nm.

17. The method of claim 14, further comprising:

prior to forming the second photoresist layer over the first metal-based hard mask, performing a surface treatment, the surface treatment chemically modifying the surface to increase an etch resistance of the first metal-based hard mask to a developer used subsequently for developing the exposed second photoresist layer.

18. The method of claim 14, wherein the unpatterned metal layer comprises ruthenium or molybdenum, wherein the first metal-based photoresist material comprises a tin-oxo nanocluster, and wherein the second metal-based photoresist material comprises a tin-oxo nanocluster.

19. A method for patterning a layer-to-be-patterned in a substrate, the method comprising:

forming, using an extreme ultraviolet (EUV) lithography process, a patterned bilayer hard mask comprising a metal layer, a first metal-based photoresist layer over the metal layer, and an adhesion layer being formed adjacent below the first metal-based photoresist layer, the bilayer hard mask being formed over the layer-to-be-patterned; and etching the layer-to-be-patterned by exposing the substrate to an etchant, the etching selectively removing a portion of the layer-to-be-patterned that is exposed to the etchant.

20. The method of claim 19, further comprising:

prior to etching the layer-to-be-patterned, forming an intermediate layer over the patterned bilayer hard mask; and forming a second metal-based hard mask over the intermediate layer, wherein forming the second metal-based hard mask comprises:

forming a second photoresist layer over the intermediate layer, the second photoresist layer comprising a second metal-based photoresist material; and exposing the second photoresist layer to a pattern of EUV radiation and developing the exposed second photoresist layer.

* * * * *